(12) United States Patent
Cho et al.

(10) Patent No.: US 10,224,502 B2
(45) Date of Patent: Mar. 5, 2019

(54) WINDOW AND DISPLAY DEVICE HAVING THE SAME

(71) Applicant: Samsung Display Co., Ltd., Yongin-si, Gyeonggi-do (KR)

(72) Inventors: Jonghwan Cho, Ansan-si (KR); Hyunseung Seo, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/178,345

(22) Filed: Jun. 9, 2016

(65) Prior Publication Data

US 2017/0098794 A1 Apr. 6, 2017

(30) Foreign Application Priority Data

Oct. 2, 2015 (KR) .................. 10-2015-0139203

(51) Int. Cl.
*H01L 51/52* (2006.01)
*H01L 51/00* (2006.01)
*B05D 7/00* (2006.01)
*G06F 1/16* (2006.01)
*H04M 1/02* (2006.01)

(52) U.S. Cl.
CPC ............... *H01L 51/52* (2013.01); *B05D 7/50* (2013.01); *G06F 1/1637* (2013.01); *H01L 51/0097* (2013.01); *H04M 1/0268* (2013.01); *G06F 1/1652* (2013.01)

(58) Field of Classification Search
CPC .. H01L 51/52; H01L 51/0097; H04M 1/0268; B05D 7/50; G06F 1/1637; G06F 1/1652
See application file for complete search history.

(56) References Cited

U.S. PATENT DOCUMENTS

| 6,670,420 B2 | 12/2003 | Bolton et al. |
| 8,508,850 B2 * | 8/2013 | Yang ..................... G02B 5/0242 |
| | | 359/599 |
| 2003/0055164 A1 * | 3/2003 | Yang ....................... C08L 53/02 |
| | | 525/70 |

(Continued)

FOREIGN PATENT DOCUMENTS

| EP | 1153981 A3 | 11/2001 |
| EP | 2733912 A1 | 5/2014 |

(Continued)

OTHER PUBLICATIONS

EPO Extended Search Report dated Jan. 9, 2017, for corresponding European Patent Application No. 16179187.6 (4 pages).

(Continued)

*Primary Examiner* — David Sample
*Assistant Examiner* — Donald M Flores, Jr.
(74) *Attorney, Agent, or Firm* — Lewis Roca Rothgerber Christie LLP

(57) ABSTRACT

A display device including a display panel and a window. The display panel includes a first curved display portion. The window covers the display panel and includes a base substrate having a light transmittance. The base substrate includes a bent portion. The bent portion is defined by bending at least a portion of the base substrate and covers the first curved display portion. The base substrate includes a composition material comprising a plurality of different polymer materials.

39 Claims, 30 Drawing Sheets

(56) References Cited

U.S. PATENT DOCUMENTS

| | | | | |
|---|---|---|---|---|
| 2010/0293782 | A1* | 11/2010 | Yamazaki | H01L 51/0097 |
| | | | | 29/825 |
| 2013/0002133 | A1* | 1/2013 | Jin | G09F 9/33 |
| | | | | 313/511 |
| 2013/0002583 | A1* | 1/2013 | Jin | G06F 1/1637 |
| | | | | 345/173 |
| 2013/0299804 | A1* | 11/2013 | Ogata | H01L 27/322 |
| | | | | 257/40 |
| 2013/0342429 | A1* | 12/2013 | Choi | H05K 13/00 |
| | | | | 345/30 |
| 2014/0029017 | A1* | 1/2014 | Lee | G01B 11/24 |
| | | | | 356/601 |
| 2014/0356586 | A1 | 12/2014 | Cho | |
| 2016/0327987 | A1* | 11/2016 | Huitema | G06F 1/1652 |

FOREIGN PATENT DOCUMENTS

| | | |
|---|---|---|
| KR | 10-2010-0081951 A | 7/2010 |
| KR | 10-2014-0142562 A | 12/2014 |
| KR | 10-2015-0002148 A | 1/2015 |
| KR | 2015-001142 A | 1/2015 |
| KR | 10-2015-0042123 A | 4/2015 |

OTHER PUBLICATIONS

Collective: "Compatibilization," Wikipedia—The Free Encyclopedia, Feb. 4, 2015, XP055499910, Retrieved from the Internet: URL: http://en.wikipedia.org/wiki/Compatibilization [retrieved on Aug. 15, 2018].

EPO Office Action dated Oct. 11, 2018, for corresponding European Patent Application No. 16179187.6 (7 pages).

* cited by examiner

WINDOW AND DISPLAY DEVICE HAVING THE SAME

CROSS-REFERENCE TO RELATED APPLICATION

This U.S. non-provisional patent application claims priority to and the benefit of Korean Patent Application No. 10-2015-0139203, filed on Oct. 2, 2015 in the Korean Intellectual Property Office, the contents of which are hereby incorporated by reference in their entirety.

BACKGROUND

1. Field

Aspects of the present disclosure relate to a window and a display device having the same.

2. Description of the Related Art

In recent years, display devices having various shapes and functions to be applied to mobile devices, such as smart phones, tablet computers, etc., have been developed. As some examples, curved display devices, bendable display devices, foldable display devices, stretchable display devices, and rollable display devices have been developed.

A display device may include a display panel and a window. A flexible display panel includes pixels formed on a flexible substrate. The window covers the display panel to protect the display panel from external impacts and stress, and the window has a shape corresponding to the shape of the display panel. Also, the window is durable and hard to endure external impacts and stress.

SUMMARY

Aspects of the present disclosure provide a window configured to be applied to a display panel having a variety of shapes.

Other aspects of the present disclosure provide a display device including the display panel and the window covering the display panel.

Embodiments of the inventive concept provide a window covering a display device, the window including a base substrate having a light transmittance and a coating layer. The coating layer is on the base substrate. The base substrate includes a bent portion. The base substrate includes a composition material including a plurality of different polymer materials.

Embodiments of the inventive concept provide a display device including a display panel and a window. The display panel includes a first curved display portion. The window covers the display panel and includes a base substrate having a light transmittance. The base substrate includes a bent portion. The bent portion is defined by bending at least a portion of the base substrate and covers the first curved display portion. The base substrate includes a composition material comprising a plurality of different polymer materials.

According to the above, because the base substrate of the window includes different polymer materials as its composition material, the various, different characteristics of the polymer materials may be realized in the base substrate. Therefore, when the base substrate includes a polymer material having a first characteristic and another polymer material having a second characteristic as its composition material, the first and second characteristics may both be easily realized in the base substrate.

For instance, when the base substrate includes polycarbonate (PC) and polymethyl methacrylate (PMMA) as its composition material, and although portions of the base substrate are bent at an angle exceeding about 90 degrees and less than about 200 degrees, impact resistance and heat resistance of the bent portions may be maintained due to the characteristics of the polycarbonate and superior light transmittance and weather resistance of the window may be maintained due to the characteristics of the polymethyl methacrylate.

BRIEF DESCRIPTION OF THE DRAWINGS

The above and other aspects and characteristics of the present disclosure will become readily apparent by reference to the following detailed description when considered in conjunction with the accompanying drawings wherein.

DETAILED DESCRIPTION

Figure 1A:
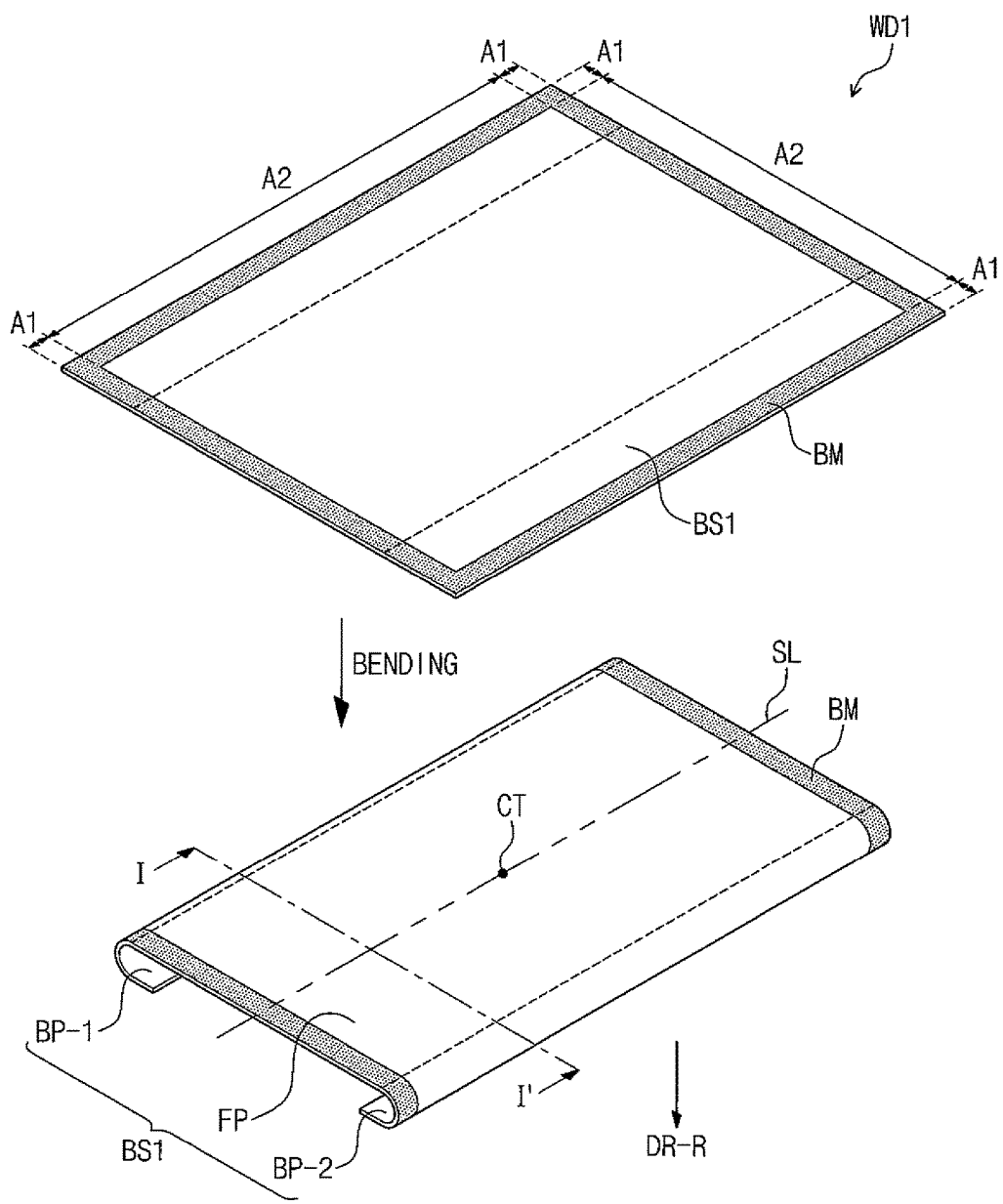
FIG. 1A is a perspective view showing a window according to an exemplary embodiment of the present disclosure.

The following description, with reference to the accompanying drawings, is provided to assist in a comprehensive understanding of various embodiments of the present disclosure as defined by the claims and their equivalents. It includes various details to assist in that understanding, but the described embodiments are to be regarded as merely exemplary. Accordingly, those of ordinary skill in the art will recognize that various changes and modifications can be made to the various embodiments described herein without departing from the scope and spirit of the present disclosure. In addition, descriptions of well-known functions and constructions may be omitted for clarity and conciseness.

It will be understood that when an element or layer is referred to as being "on," "connected to," or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

The devices on the driving circuit substrate and/or any other relevant devices or components according to embodiments of the present invention described herein may be implemented utilizing any suitable hardware, firmware (e.g., an application-specific integrated circuit), software, and/or a suitable combination of software, firmware, and hardware. For example, the various components of the devices may be formed on one integrated circuit (IC) chip or on separate IC chips. Further, the various components of the devices may be implemented on a flexible printed circuit film, a tape carrier package (TCP), a printed circuit board (PCB), or formed on a same substrate as the devices. Further, the various components of the devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device or the functionality of a particular computing device may be distributed across one or more other computing devices without departing from the scope of the exemplary embodiments of the present invention.

Hereinafter, aspects of the present invention will be explained in further detail with reference to the accompanying drawings.

Figure 1B:
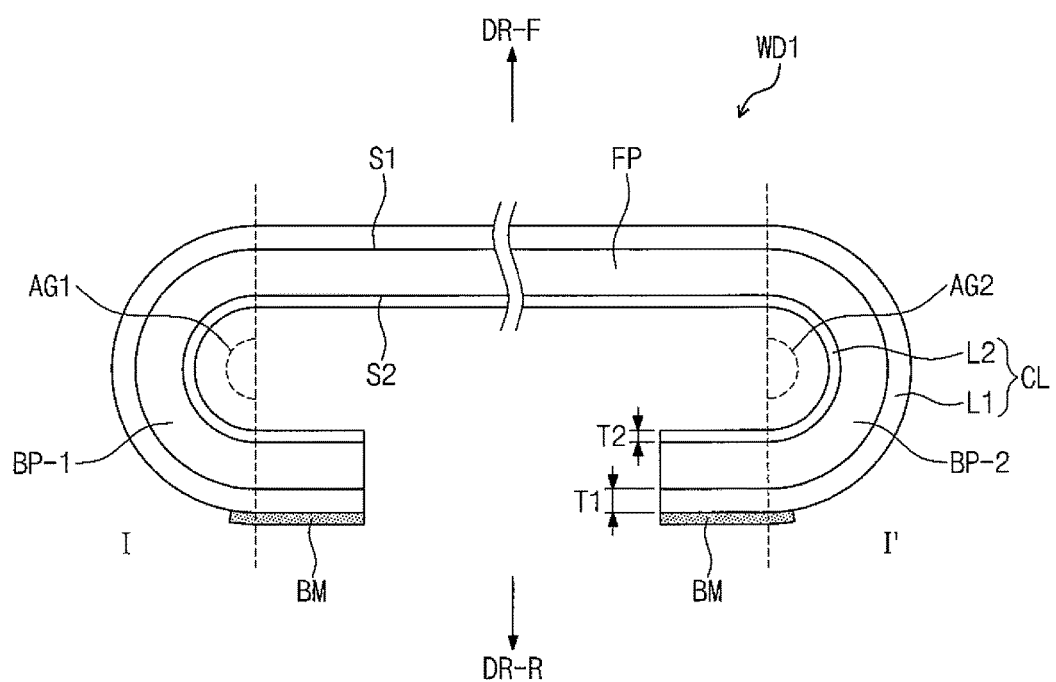
FIG. 1B is a cross-sectional view taken along the line I-I' of FIG. 1.

FIG. 1A is a perspective view showing a window WD1 according to an exemplary embodiment of the present disclosure, and FIG. 1B is a cross-sectional view of the window WD1 taken along the line I-I' of FIG. 1. FIG. 1A shows the window both in a flat state and in a bent state.

Referring to FIGS. 1A and 1B, the window WD1 may be a component of a display device. For example, the window WD1 may cover a display panel of the display device to protect the display panel from external impacts and stress.

The window WD1 includes a base substrate BS1, a coating layer CL, and a light blocking layer BM.

The base substrate BS1 transmits light (e.g., the base substrate BS1 is transparent) and has a substantially planar shape. The coating layer CL is coated on the base substrate BS1 to improve the hardness of the window WD1.

The light blocking layer BM is disposed on the base substrate BS1 corresponding to an edge of the window WD1 (e.g., the light blocking layer BM is on or extends from an edge of the base substrate BS1) to block the light. Accordingly, a light blocking area A1 is defined in the window WD1 corresponding to a position at which the light blocking layer BM is disposed (e.g., a portion of the window WD1 at where the light blocking layer BM is arranged is the light blocking area A1), and a transmission area A2 is defined in the window WD1 corresponding to a position at which the light blocking layer BM is not disposed (e.g., a portion of the window WD1 other than where the light blocking layer BM is arranged is the transmission area A2).

When the window WD1 is on or covers the display panel, a non-display portion of the display panel, such as a pad (e.g., a pad part or pad portion), a line (e.g., a line part or line portion), etc., is overlapped with the light blocking area A1 and a display portion of the display panel is overlapped with the transmission area A2.

In the present exemplary embodiment, the base substrate BS1 includes a flat cover portion FP (e.g., a flat cover part), a first bending portion BP-1 (e.g., a first bending part), and a second bending portion BP-2 (e.g., a second bending part).

The flat cover portion FP has a substantially flat or planar shape and covers a flat portion and a flat display area of the display panel. In addition, each of the first and second bending portions BP-1 and BP-2 covers a bent portion and a curved display area of the display panel.

The first and second bending portions BP-1 and BP-2 correspond to two edges facing each other of the window WD1 in a one-to-one correspondence (e.g., the first and second bending portions BP-1 and BP-2 are at opposite edges of the flat cover portion FP). According to another embodiment, the first and second bending portions BP-1 and BP-2 may be disposed at positions other than the two edges. For instance, at least one of the first and second bending portions BP-1 and BP-2 may be disposed at a center portion of the window WD1 or around the center portion of the window WD1.

Each of the first and second bending portions BP-1 and BP-2 is bent in a rear surface direction DR-R of the window WD1 (e.g., each of the first and second bending portions BP-1 and BP-2 is bent toward a rear surface of the window WD1). The first bending portion BP-1 extends from (e.g., is connected to) the flat cover portion FP, the second bending portion BP-2 extends from (e.g., is connected to) the flat cover portion FP, and the flat cover portion FP is disposed between the first and second bending portions BP-1 and BP-2. The first bending portion BP-1 and the second bending portion BP-2 are disposed to be symmetrical with each other with respect to a reference line SL crossing a center position CT (e.g., a center) of the base substrate BS1 to divide the base substrate BS1 into two equal parts.

In the present exemplary embodiment, each of the first and second bending portions BP-1 and BP-2 is bent at an angle exceeding about 90 degrees and less than about 200 degrees with respect to the base substrate BS1 (e.g., with respect to the flat cover portion FP). For example, when the first bending portion BP-1 is bent in a counter-clockwise direction with respect to the flat cover portion FP to have a first angle AG1 with respect to the flat cover portion FP and the second bending portion BP-2 is bent in a clockwise direction with respect to the flat cover portion FP to have a second angle AG2 with respect to the flat cover portion FP, each of the first and second angles AG1 and AG2 exceeds about 90 degrees and is less than about 200 degrees. In the present exemplary embodiment shown in FIG. 1B, each of the first and second angles AG1 and AG2 may be about 180 degrees.

In an embodiment in which each of the first and second angles AG1 and AG2 exceeds about 90 degrees, the light blocking layer BM partially overlaps the first and second bending portions BP-1 and BP-2 in a front direction DR-F of the window WD1 (e.g., the light blocking layer BM extends onto the first and second bending portions BP-1 and BP-2). Thus, when a user sees the window WD1 from the front direction DR-F, a portion of the first and second bending portions BP-1 and BP-2 is covered by the light blocking layer BM. Accordingly, in such an embodiment, the user feels that the image displayed in the display panel is expanded in the front direction DR-F.

In another embodiment in which each of the first and second angles AG1 and AG2 exceeds about 200 degrees, a crack may form in a portion of the window WD1 that is bent beyond about 200 degrees, and as a result, an impact resistance of the window WD1 may be reduced or compromised.

The coating layer CL is coated on the base substrate BS1. The coating layer CL includes an organic material, an inorganic material, or a hybrid material formed by mixing an organic material and an inorganic material. For instance, the organic material may include an acrylic-based compound and/or an epoxy-based compound, and the inorganic material may include silica and alumina.

The coating layer CL includes a first layer L1 and a second layer L2. The first layer L1 is coated on a front surface S1 (e.g., an outer surface) of the base substrate BS1, and the second layer L2 is coated on a rear surface S2 (e.g., an inner surface) of the base substrate BS1.

In another embodiment in which the coating layer CL is coated on only one of the front surface S1 and the rear surface S2, a contractive force (e.g., a constricting force or tensile force) is applied to only the respective front surface S1 or rear surface S2. Thus, the window WD1 may be bent due to the coating layer CL. However, according to the present exemplary embodiment, because the coating layer CL is coated on the front surface S1 and on the rear surface S2, the window WD1 may not be bent due to the contractive force.

In the present exemplary embodiment, the first layer L1 may have a multi-layer structure including layers of different materials. Accordingly, the first layer L1 may have a first thickness T1 that is greater than a second thickness T2 of the second layer L2. Because the window WD1 includes the coating layer CL including the first and second layers L1 and L2, the window WD1 may not be bent and the impact resistance of the window WD1 against impacts and stress applied to the front surface S1 of the window WD1 may be improved.

Figure 2A:
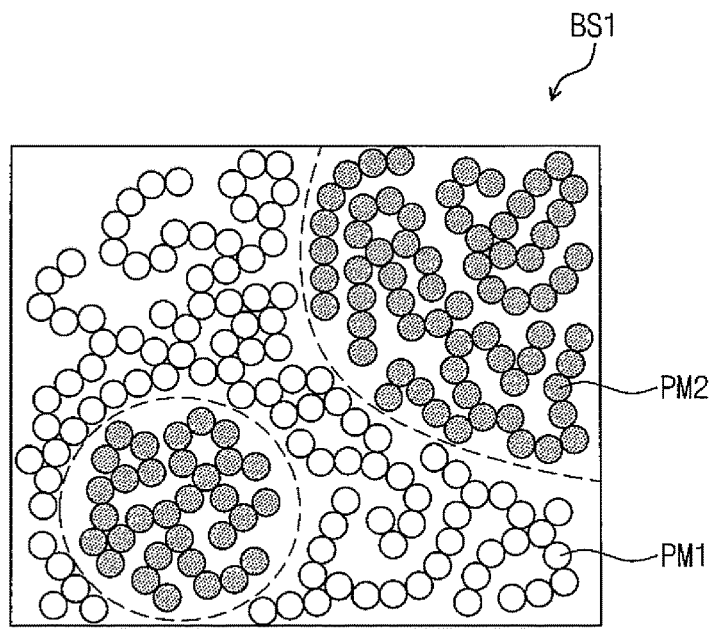
FIG. 2A is a view showing a mixed state of first, second, and third polymers of a base substrate of a window according to an exemplary embodiment of the present disclosure.
Figure 2B:
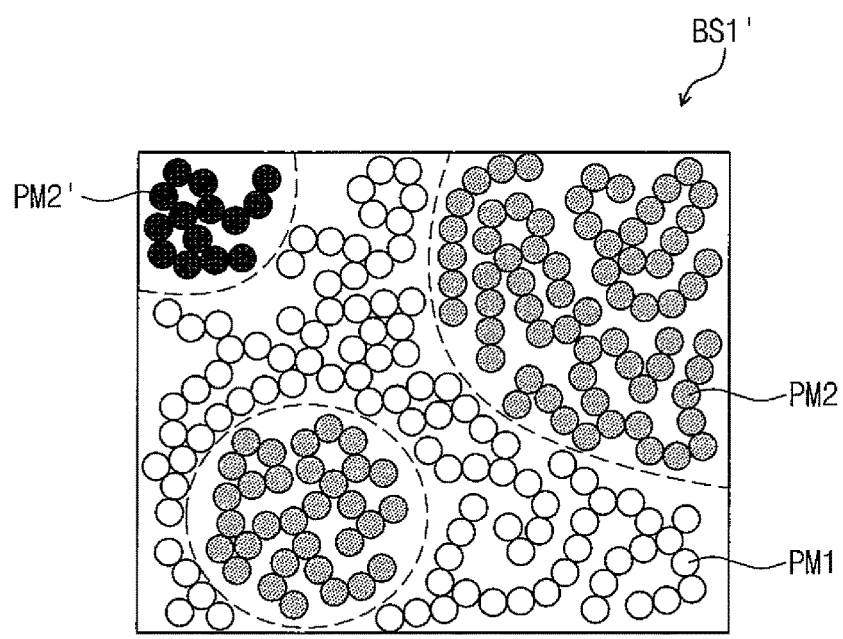
FIG. 2B is a view showing a mixed state of first, second, and third polymers of a base substrate of a window according to another exemplary embodiment of the present disclosure.

FIG. 2A is a view showing a mixed state of first, second, and third polymers of a base substrate of a window according to an exemplary embodiment of the present disclosure, and FIG. 2B is a view showing a mixed state of first, second, and third polymers of a base substrate of a window according to another exemplary embodiment of the present disclosure.

Referring to FIGS. 1A, 1B, and 2A, the base substrate BS1 includes a first polymer PM1 and a second polymer PM2 as its composition material, and the first polymer PM1 and the second polymer PM2 are different from each other.

In another embodiment in which the base substrate BS1 includes only a single polymer as its composition material, the characteristics of the base substrate BS1 may be limited to the characteristics of the polymer. For instance, when a first base substrate including only polycarbonate (PC) is compared with a second base substrate including only polymethyl methacrylate (PMMA), the first base substrate has lower light transmittance than that of the second substrate but the first base substrate has superior impact resistance than that of the second substrate.

However, according to the present exemplary embodiment, when the base substrate BS1 includes the different first and second polymers PM1 and PM2 as its composition material, the characteristics of each of the first and second polymers PM1 and PM2 may be reflected in the base substrate BS1. For instance, when the first polymer PM1 is polycarbonate (PC) and the second polymer PM2 is polymethyl methacrylate (PMMA), the light transmittance of the base substrate BS1 may be greater than that of the second base substrate including only polycarbonate (PC) and the impact resistance of the base substrate BS1 may be greater than that of the first base substrate including only polymethyl methacrylate (PMMA). Accordingly, although the base substrate BS1 is bent at an angle exceeding about 90 degrees and less than about 200 degrees, the impact resistance of the base substrate BS1 is maintained due to the characteristics of the polycarbonate (PC), and thus, a crack may not form in the bending portion. In addition, the base substrate BS1 may have superior light transmittance due to the characteristics of the polymethyl methacrylate (PMMA).

In the present exemplary embodiment, the first polymer PM1 is present in the base substrate BS1 in an amount of about 60 weight percent to about 95 weight percent with respect to the total material of the base substrate BS1, and the second polymer PM2 is present in the base substrate BS1 in an amount of about 5 weight percent to about 40 weight percent with respect to the total material of the base substrate BS1. In addition, the first polymer PM1 in the base substrate BS1 may have a continuous phase (e.g., may be continuously present), and the second polymer PM2 in the base substrate BS1 may have a dispersed phase, for example, dispersed in (e.g., may be dispersed throughout) the first polymer PM1.

In another embodiment in which the first polymer PM1 is present in the base substrate BS1 in an amount less than about 60 weight percent with respect to the total material of the base substrate BS1, the characteristics of the first polymer PM1 may not be primary characteristics of the base substrate BS1. In addition, when the second polymer PM2 is present in the base substrate BS1 in an amount less than about 5 weight percent with respect to the total material of the base substrate BS1, the characteristics of the second polymer PM2 may not be secondary characteristics in the base substrate BS1.

In the present exemplary embodiment, the first polymer PM1 includes polycarbonate (PC), and the second polymer PM2 includes one of polymethyl methacrylate (PMMA), polyethylene terephthalate (PET), polyethersulfone (PES), and polyethylene naphthalate (PEN).

The first and second polymers PM1 and PM2 are not limited to the above-mentioned materials. For example, when the intended primary characteristics and the secondary characteristics of the base substrate BS1 are defined, the first polymer PM1 includes a polymer material having the primary characteristics and the second polymer PM1 includes a polymer material having the secondary characteristics.

In the present exemplary embodiment, the base substrate BS1 may further include a compatibilizer in its composition material. The compatibilizer allows the first polymer PM1 to be easily mixed with the second polymer PM2 in the base substrate BS1. Therefore, a mixture ratio of the first and second polymers PM1 and PM2 becomes constant or substantially constant over the entire area of the base substrate BS1 due to the compatibilizer.

Referring to FIGS. 1A, 1B, and 2B, a base substrate BS1' includes a first polymer PM1 and second polymers PM2 and PM2' as its composition material. The second polymers PM2 and PM2' are different from each other, and each of the second polymers PM2 and PM2' is different from the first polymer PM1.

Similar to the embodiment described above with reference to FIG. 2A, the first polymer PM1 is present in the base substrate BS1' in an amount of about 60 weight percent to about 95 weight percent with respect to the total material of the base substrate BS1', and the second polymers PM2 and PM2' are present in the base substrate BS1' in an amount of about 5 weight percent to about 40 weight percent with respect to the total material of the base substrate BS1'. In addition, the first polymer PM1 in the composition material of the base substrate BS1' may have a continuous phase, and each of the second polymers PM2 and PM2' in the composition material of the base substrate BS1' may have a dispersed phase, for example, dispersed in the first polymer PM1.

In the present exemplary embodiment, the first polymer PM1 includes PC, and the second polymers PM2 and PM2' include at least two of PMMA, PET, PES, and PEN.

Figure 3:
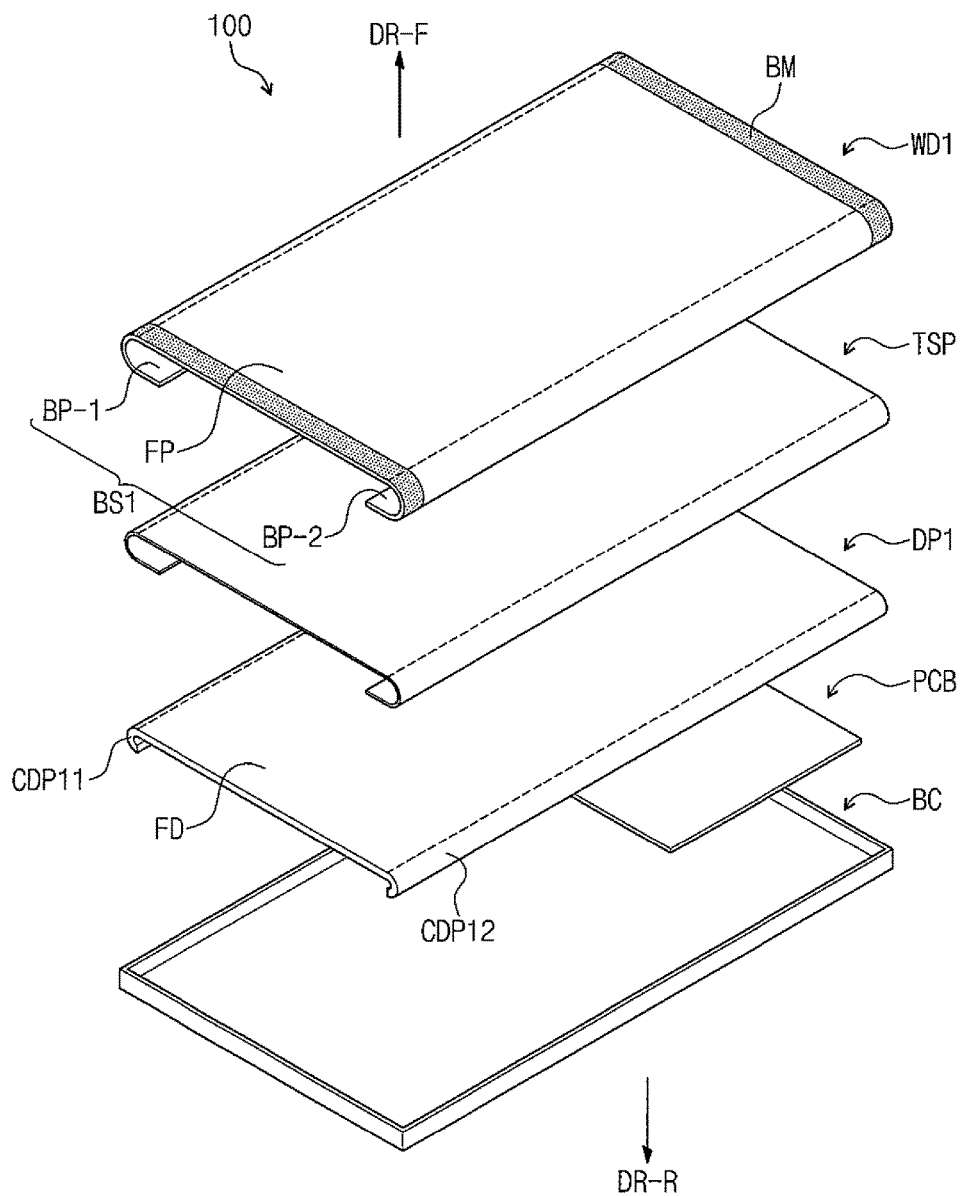
FIG. 3 is an exploded perspective view showing a display device including the window shown in FIGS. 1A and 1B.

FIG. 3 is an exploded perspective view showing a display device 100 including the window WD1 shown in FIGS. 1A and 1B. In the following description with reference to FIG. 3, detailed descriptions of the window WD1 may be omitted in order to avoid redundancy.

Referring to FIG. 3, the display device 100 includes an accommodating member BC (e.g., a housing), a driving circuit substrate PCB, a display panel DP1, a touch panel TSP, and the window WD1.

FIG. 3 shows the display device 100 applied to a mobile phone as a representative example, but the display device 100 may be applied to, as some examples, a television set, a monitor, a tablet computer, a smart watch, and a game unit to display an image.

The accommodating member BC includes a bottom portion and sidewalls extending from the bottom portion to define an accommodating space therein. The accommodating member BC accommodates the driving circuit substrate PCB and the display device 100 in the accommodating space.

The touch panel TSP is disposed between the window WD1 and the display panel DP1 and is configured to receive or generate a touch signal applied to the window WD1. The touch signal is generated when the user applies pressure onto the window WD1, and the touch panel TSP converts the applied pressure into an electrical signal to, for example, interact with the display panel DP1.

The display panel DP1 may be flexible. For instance, the display panel DP1 may be, but is not limited to, an organic light emitting diode (OLED) display panel. The display panel DP1 may include a flexible base substrate and pixels disposed on the base substrate. Each of the pixels includes an organic light emitting diode.

The display panel DP1 is bent to correspond to the shape of the first and second bending portions BP-1 and BP-2 of the window WD1. For example, the display panel DP1 includes a flat display portion FD (e.g., a flat display part), a first curved display portion CDP11 (e.g., a first curved display part), and a second curved display portion CDP12 (e.g., a second curved display part). Each of the first and second curved display portions CDP11 and CDP12 is bent in the rear surface direction DR-R of the display panel DP1. In addition, the flat display portion FD has a flat shape corresponding to the flat cover portion FP.

The display panel DP1 displays the image at each of the flat display portion FD, the first curved display portion CDP11, and the second curved display portion CDP12. For instance, a main image, such as an internet screen, is displayed at the flat display portion FD, and a sub-image including information, such as a text message, a clock, data, weather information, etc., is displayed at each of the first and second curved display portions CDP11 and CDP12.

When the display panel DP1 is coupled to the window WD1, the window WD1 covers the surface of the display panel DP1 on which the image is displayed to protect the display panel DP1 from external impacts and stress. For example, the first bending portion BP-1 covers the first curved display portion CDP11, the second bending portion BP-2 covers the second curved display portion CDP12, and the flat cover portion FP covers the flat display portion FD.

The driving circuit substrate PCB includes a plurality of devices for generating a driving signal and a data signal, which are applied to the pixels of the display panel DP1. In addition, the driving circuit substrate PCB is electrically connected to the display panel DP1 to apply the driving signal and the data signal to the pixels.

Figure 4A:
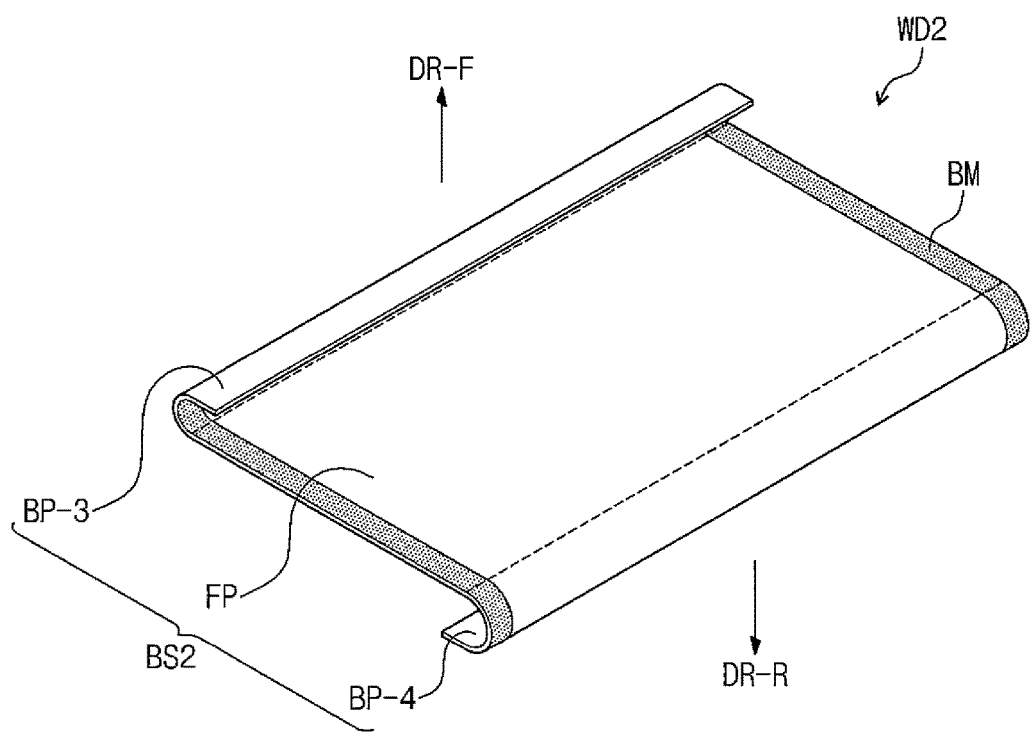
FIG. 4A is a perspective view showing a window according to another exemplary embodiment of the present disclosure.
Figure 4B:
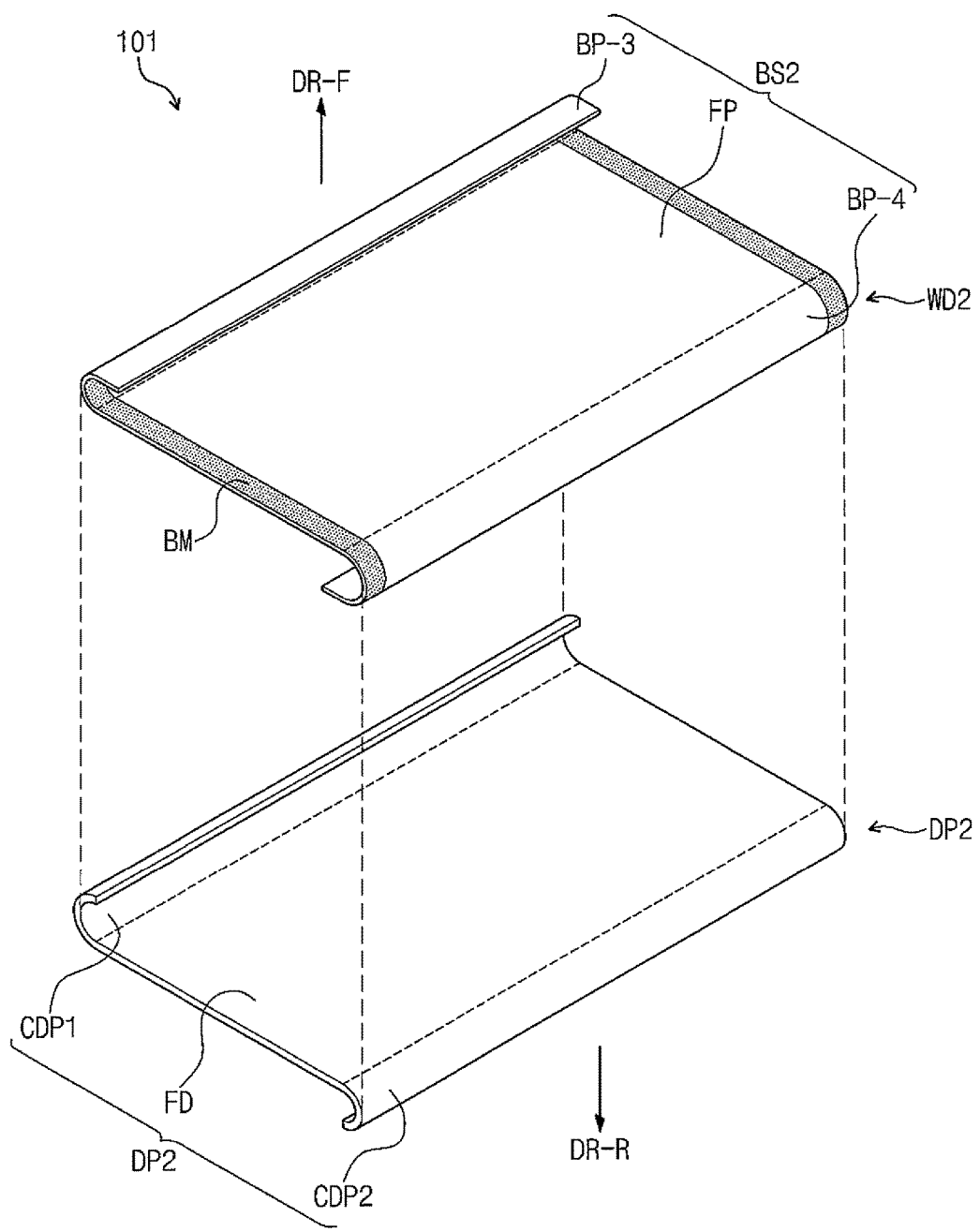
FIG. 4B is a perspective view showing a display device including the window shown in FIG. 4A.

FIG. 4A is a perspective view showing a window WD2 according to another exemplary embodiment of the present disclosure, and FIG. 4B is a perspective view showing a display device 101 including the window WD2 shown in FIG. 4A. In FIGS. 4A and 4B, the same reference numerals denote the same elements in the earlier described embodiments, and thus, detailed descriptions of the same elements may be omitted.

Referring to FIG. 4A, the window WD2 includes a base substrate BS2, a light blocking layer BM, and a coating layer. The base substrate BS2 includes a flat cover portion FP, a first bending portion BP-3, and a second bending portion BP-4. The base substrate BS2 includes (e.g., is formed of) at least two polymer materials different from each other as its composition material.

In the present exemplary embodiment, the first and second bending portions BP-3 and BP-4 are disposed to correspond to two edges facing each other of the window WD2 in a one-to-one correspondence. According to another embodiment, the first and second bending portions BP-3 and BP-4 may be disposed at positions other than the two edges. For instance, at least one of the first and second bending portions BP-3 and BP-4 may be disposed at a center portion of the window WD2 or around the center portion of the window WD2.

Similar to the first and second bending portions BP-1 and BP-2 described above, each of the first and second bending portions BP-3 and BP-4 is bent at an angle exceeding about 90 degrees and less than about 200 degrees with respect to the base substrate BS2.

The first bending portion BP-3 is bent in the front direction DR-F of the window WD2, and the second bending portion BP-4 is bent in the rear direction DR-R of the window WD2.

Referring to FIG. 4B, the window WD2 covers a display panel DP2 of the display device 101.

In the present exemplary embodiment, the display panel DP2 is flexible and is bent to correspond to the shape of the first and second bending portions BP-3 and BP-4 of the window WD2. For example, the display panel DP2 includes a flat display portion FD, a first curved display portion CDP1, and a second curved display portion CDP2. The first curved display portion CDP1 is bent in the front direction DR-F of the display panel DP2 to correspond to the shape of the first bending portion BP-3, and the second curved display portion CDP2 is bent in the rear direction DR-R of the display panel DP2 to correspond to the shape of the second bending portion BP-4. In addition, the flat display portion FD has the flat shape corresponding to the flat cover portion FP.

When the display panel DP2 is coupled to the window WD2, the first bending portion BP-3 covers the first curved display portion CDP1, the second bending portion BP-4 covers the second curved display portion CDP2, and the flat cover portion FP covers the flat display portion FD. Accordingly, the window WD2 covers the surface of the display panel DP2 on which the image is displayed to protect the display panel DP2 from external impacts and stress.

Figure 5A:
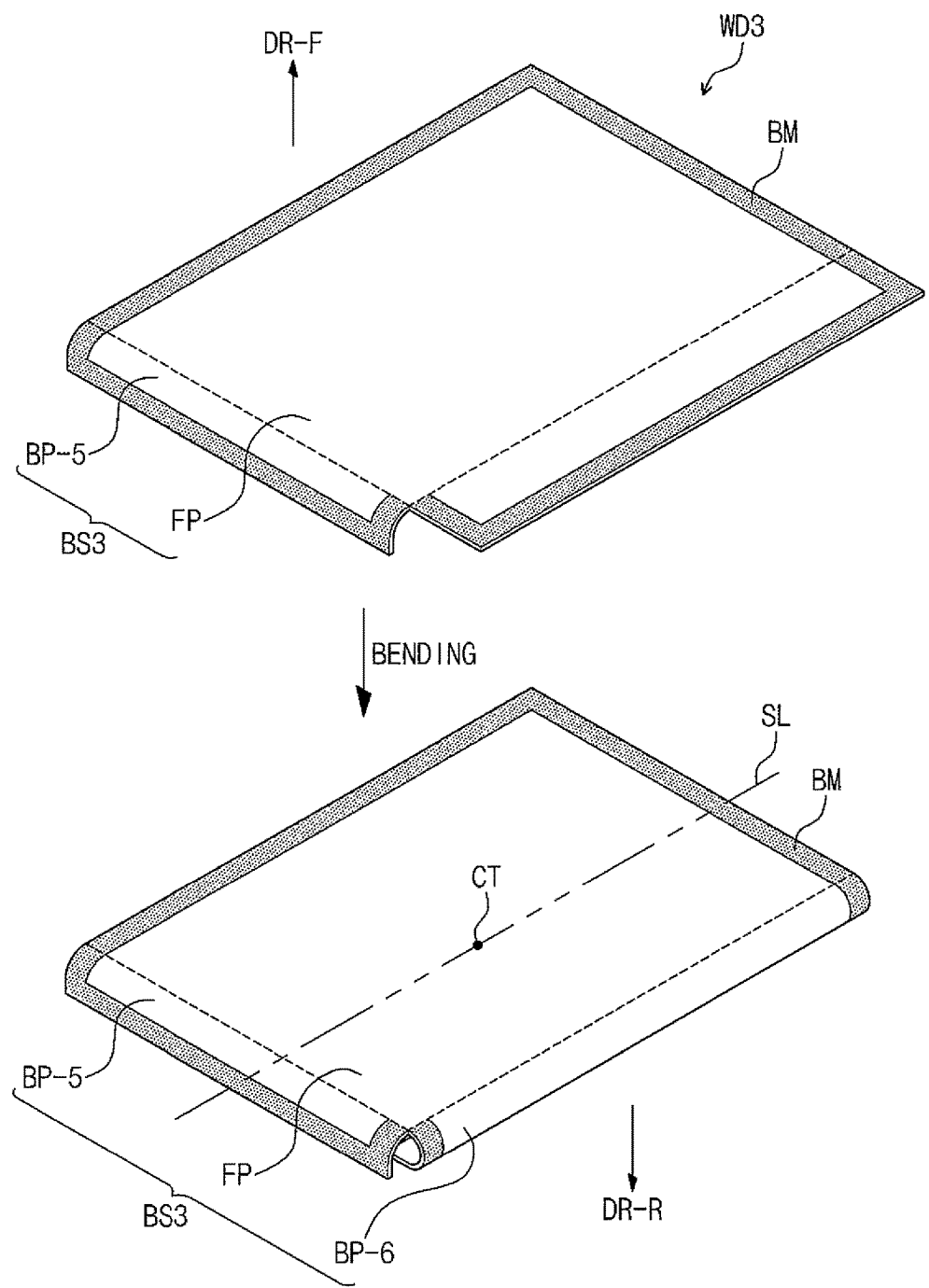
FIG. 5A is a perspective view showing a window according to another exemplary embodiment of the present disclosure.
Figure 5B:
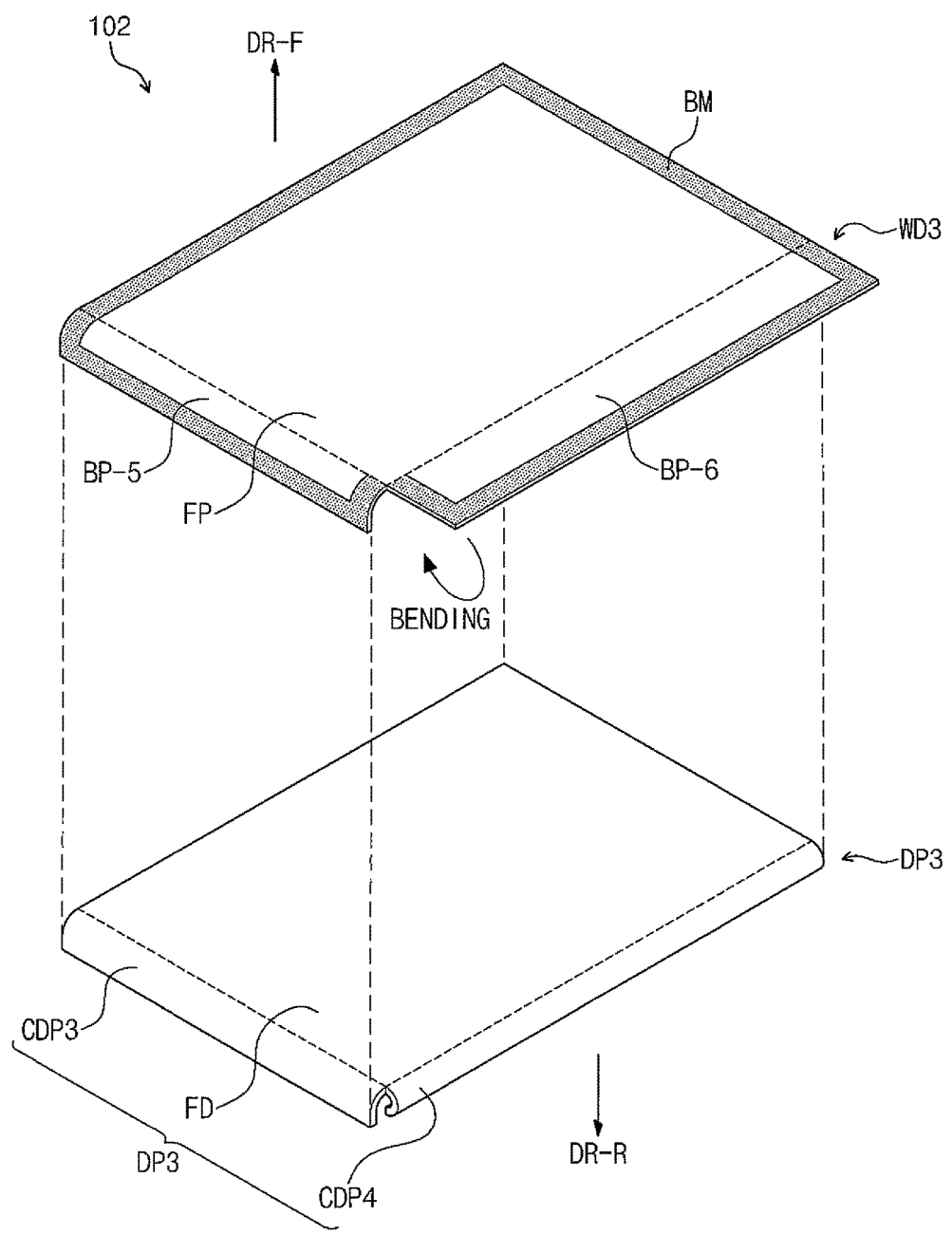
FIG. 5B is a perspective view showing a display device including the window shown in FIG. 5A.

FIG. 5A is a perspective view showing a window WD3 according to another exemplary embodiment of the present disclosure, and FIG. 5B is a perspective view showing a display device 102 including the window WD3 shown in FIG. 5A. In FIGS. 5A and 5B, the same reference numerals denote the same elements in the earlier described embodiments, and thus, detailed descriptions of the same elements may be omitted.

Referring to FIG. 5A, the window WD3 includes a base substrate BS3, a light blocking layer BM, and a coating layer. The base substrate BS3 includes (e.g., is formed of) at least two different polymer materials as its composition material and includes a flat cover portion FP, a bending portion BP-6, and a sub-bending portion BP-5.

In the present exemplary embodiment, the bending portion BP-6 and the sub-bending portion BP-5 are disposed to correspond to two edges, not facing each other, of the window WD3 in a one-to-one correspondence. The bending portion BP-6 and the sub-bending portion BP-5 are disposed to be asymmetrical with each other with respect to a reference line SL crossing a center position CT of the base substrate BS3 to divide the base substrate BS3 into two equal parts.

The sub-bending portion BP-5 is bent in the rear direction DR-R with respect to the base substrate BS3, and the bending portion BP-6 is bent at an angle exceeding about 90 degrees and less than about 200 degrees with respect to the base substrate BS3.

The sub-bending portion BP-5 is bent at an angle smaller than that of the bending portion BP-6, and the angle of the sub-bending portion BP-5 exceeds about 30 degrees and is equal to or smaller than about 90 degrees. For instance, the bending portion BP-6 is bent in a clockwise direction with respect to the flat cover portion FP at an angle of about 180 degrees with respect to the flat cover portion FP, and the sub-bending portion BP-5 is bent in a counter-clockwise direction with respect to the flat cover portion FP at an angle of about 90 degrees with respect to the flat cover portion FP.

In an embodiment in which the sub-bending portion BP-5 is bent at an angle equal to or smaller than about 30 degrees, visibility of a first curved display portion CDP3 (refer to FIG. 5B) covered by the sub-bending portion BP-5 in a diagonal direction with respect to the front direction DR-F of the window WD3 may be reduced. In addition, in an embodiment in which the sub-bending portion BP-5 is bent at an angle exceeding about 90 degrees, the sub-bending portion BP-5 has the same or substantially the same design as the bending portion BP-6.

Referring to FIG. 5B, the window WD3 covers a display panel DP3 of the display device 102.

In the present exemplary embodiment, the display panel DP3 is flexible and is bent to correspond to the shape of the sub-bending portion BP-5 and the bending portion BP-6 of the window WD3.

For example, the display panel DP3 includes a flat display portion FD, a first curved display portion CDP3, and a second curved display portion CDP4. The first curved display portion CDP3 is bent in the rear direction DR-R of the display panel DP3 to correspond to the shape of the sub-bending portion BP-5, and the second curved display portion CDP4 is bent in the rear direction DR-R of the display panel DP3 to correspond to the shape of the bending portion BP-6. In addition, the flat display portion FD has a flat shape corresponding to the flat cover portion FP.

In the present exemplary embodiment, each of the first and second curved display portions CDP3 and CDP4 is bent at an angle of about 90 degrees. According to another embodiment, the angle at which each of the first and second curved display portions CDP3 and CDP4 is bent exceeds about 90 degrees and is less than about 200 degrees.

When the display panel DP3 is coupled to the window WD3, the sub-bending portion BP-5 covers the first curved display portion CDP3, the bending portion BP-6 covers the second curved display portion CDP4, and the flat cover portion FP covers the flat display portion FD.

Figure 6A:
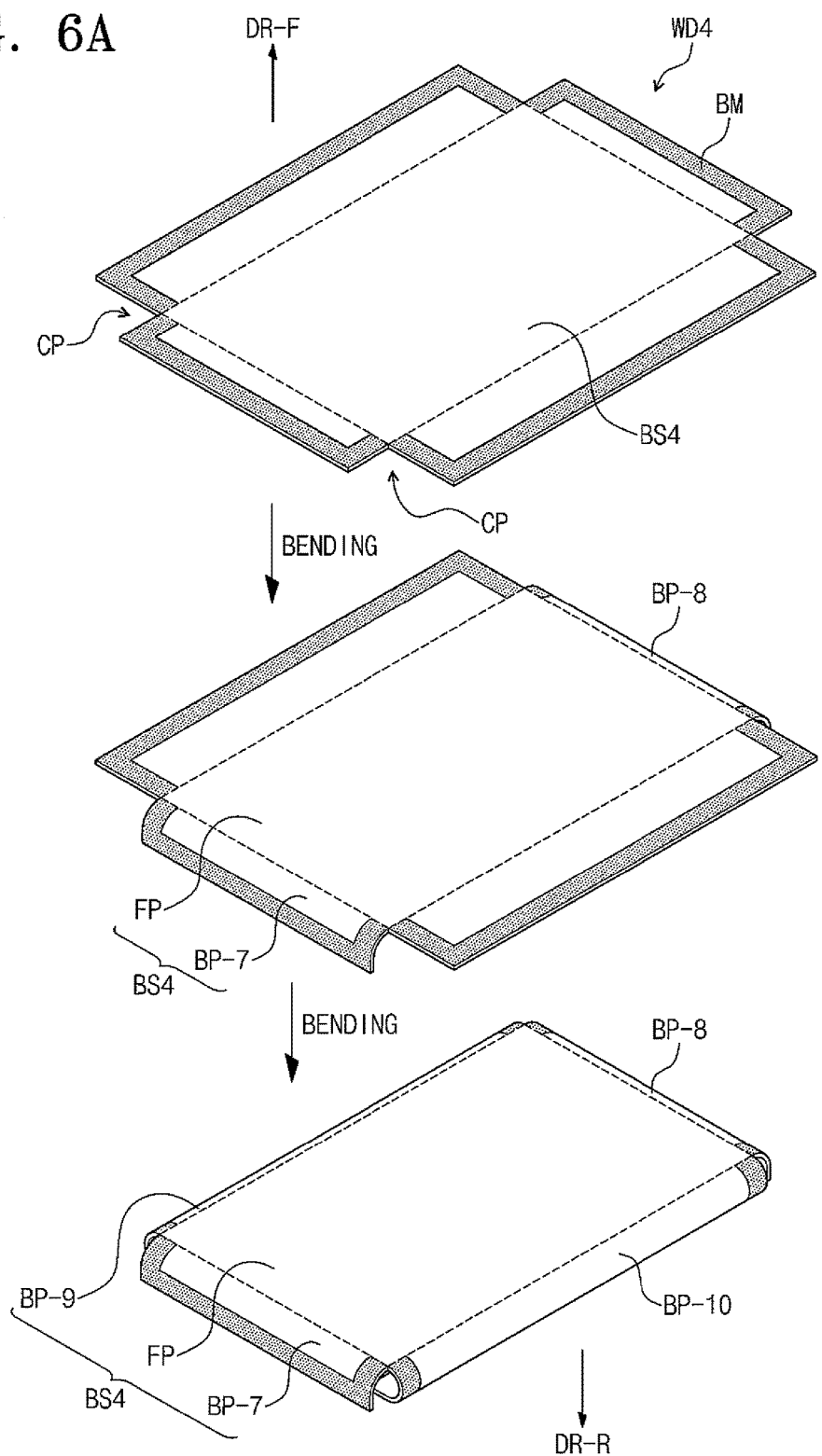
FIG. 6A is a perspective view showing a window according to another exemplary embodiment of the present disclosure.
Figure 6B:
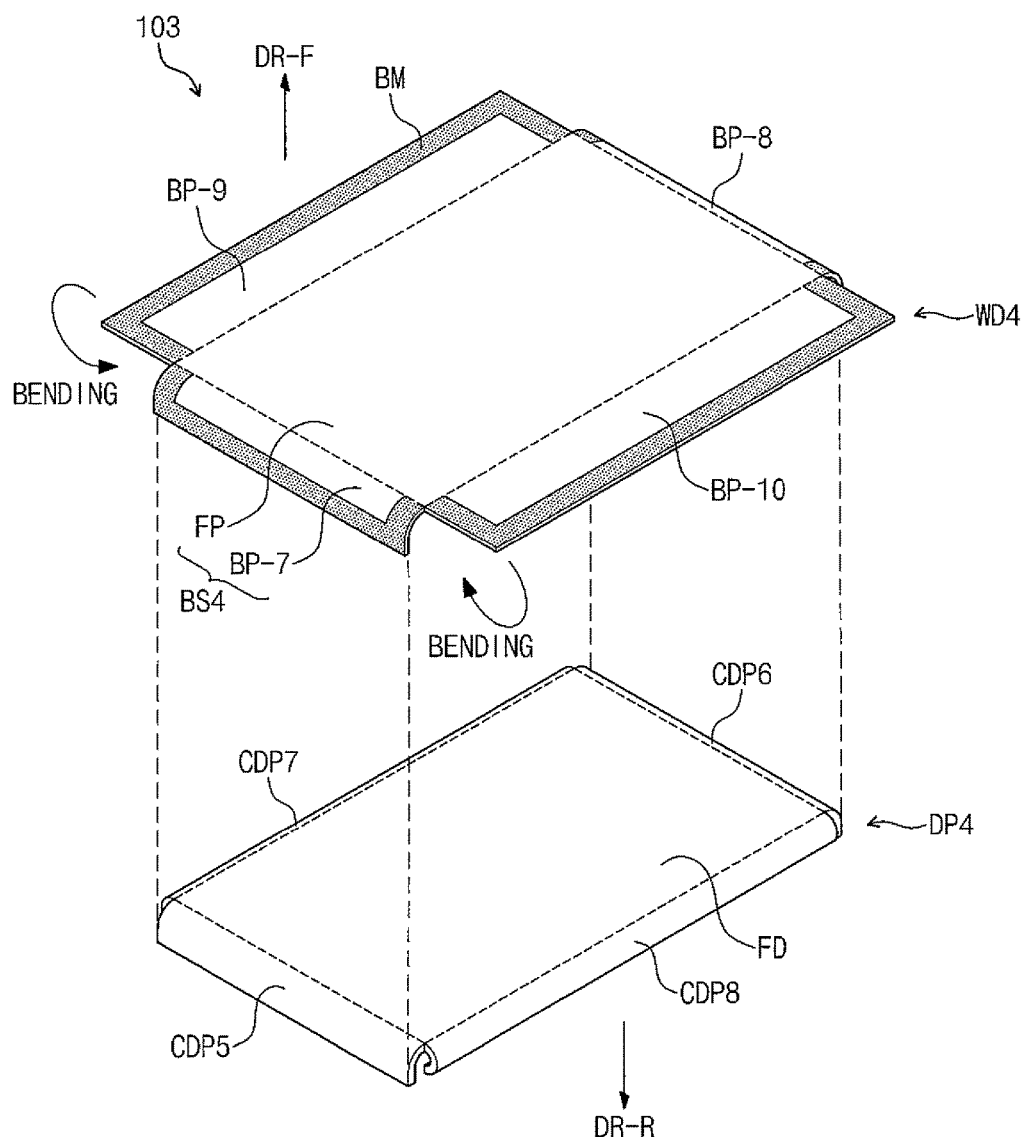
FIG. 6B is a perspective view showing a display device including the window shown in FIG. 6A.

FIG. 6A is a perspective view showing a window WD4 according to another exemplary embodiment of the present disclosure, and FIG. 6B is a perspective view showing a display device 103 including the window WD4 shown in FIG. 6A. In FIGS. 6A and 6B, the same reference numerals denote the same elements in the earlier described embodiments, and thus, detailed descriptions of the same elements may be omitted.

Referring to FIG. 6A, the window WD4 includes a base substrate BS4, a light blocking layer BM, and a coating layer. The base substrate BS4 includes (e.g., is formed of) at least two polymer materials different from each other as its composition material and includes a flat cover portion FP, a first sub-bending portion BP-7, a second sub-bending portion BP-8, a first bending portion BP-9, and a second bending portion BP-10.

In the present exemplary embodiment, the first sub-bending portion BP-7, the second sub-bending portion BP-8, the first bending portion BP-9, and the second bending portion BP-10 correspond to four edges of the window WD4 in a one-to-one correspondence. In addition, each of the first sub-bending portion BP-7, the second sub-bending portion BP-8, the first bending portion BP-9, and the second bending portion BP-10 is bent in the rear direction DR-R.

Each of the first and second bending portions BP-9 and BP-10 is bent at an angle exceeding about 90 degrees and less than about 200 degrees with respect to the flat cover portion FP. In addition, each of the first and second sub-bending portions BP-7 and BP-8 is bent at an angle smaller than that of the first and second bending portions BP-9 and BP-10 with respect to the flat cover portion FP.

In the present exemplary embodiment, four corners of the base substrate BS4 are cut away to define cut-away portions CP, and the shapes of the bending portions may be easily realized in the base substrate BS4 by the cut-away portions CP.

Referring to FIG. 6B, the window WD4 covers a display panel DP4 of the display device 103.

In the present exemplary embodiment, the display panel DP4 is flexible and is bent to correspond to the shape of the first sub-bending portion BP-7, the second sub-bending portion BP-8, the first bending portion BP-9, and the second bending portion BP-10 of the window WD4.

For example, the display panel DP4 includes a flat display portion FD and first, second, third, and fourth curved display portions CDP5, CDP6, CDP7, and CDP8. The first and second curved display portions CDP5 and CDP6 are bent to correspond to the first and second sub-bending portions BP-7 and BP-8 in a one-to-one correspondence, and the third and fourth curved display portions CDP7 and CDP8 are bent to correspond to the first and second bending portions BP-9 and BP-10 in a one-to-one correspondence.

In the present exemplary embodiment, each of the first to fourth curved display portions CDP5 to CDP8 is bent at an angle of about 90 degrees. According to another embodiment, the angle at which each of the first to fourth curved display portions CDP5 to CDP8 is bent exceeds about 90 degrees and is less than about 200 degrees.

When the display panel DP4 is coupled to the window WD4, the first sub-bending portion BP-7 covers the first curved display portion CDP5, the second sub-bending portion BP-8 covers the second curved display portion CDP6, the first bending portion BP-9 covers the third curved display portion CDP7, and the second bending portion BP-10 covers the fourth curved display portion CDP8.

Figure 7A:
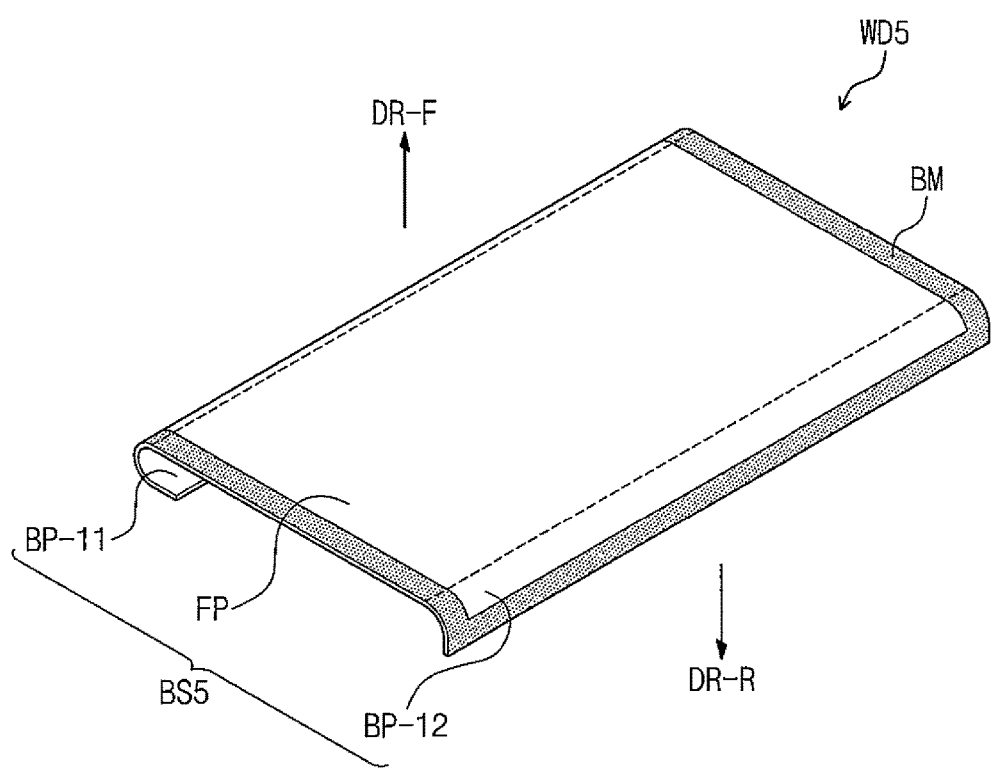
FIG. 7A is a perspective view showing a window according to another exemplary embodiment of the present disclosure.
Figure 7B:
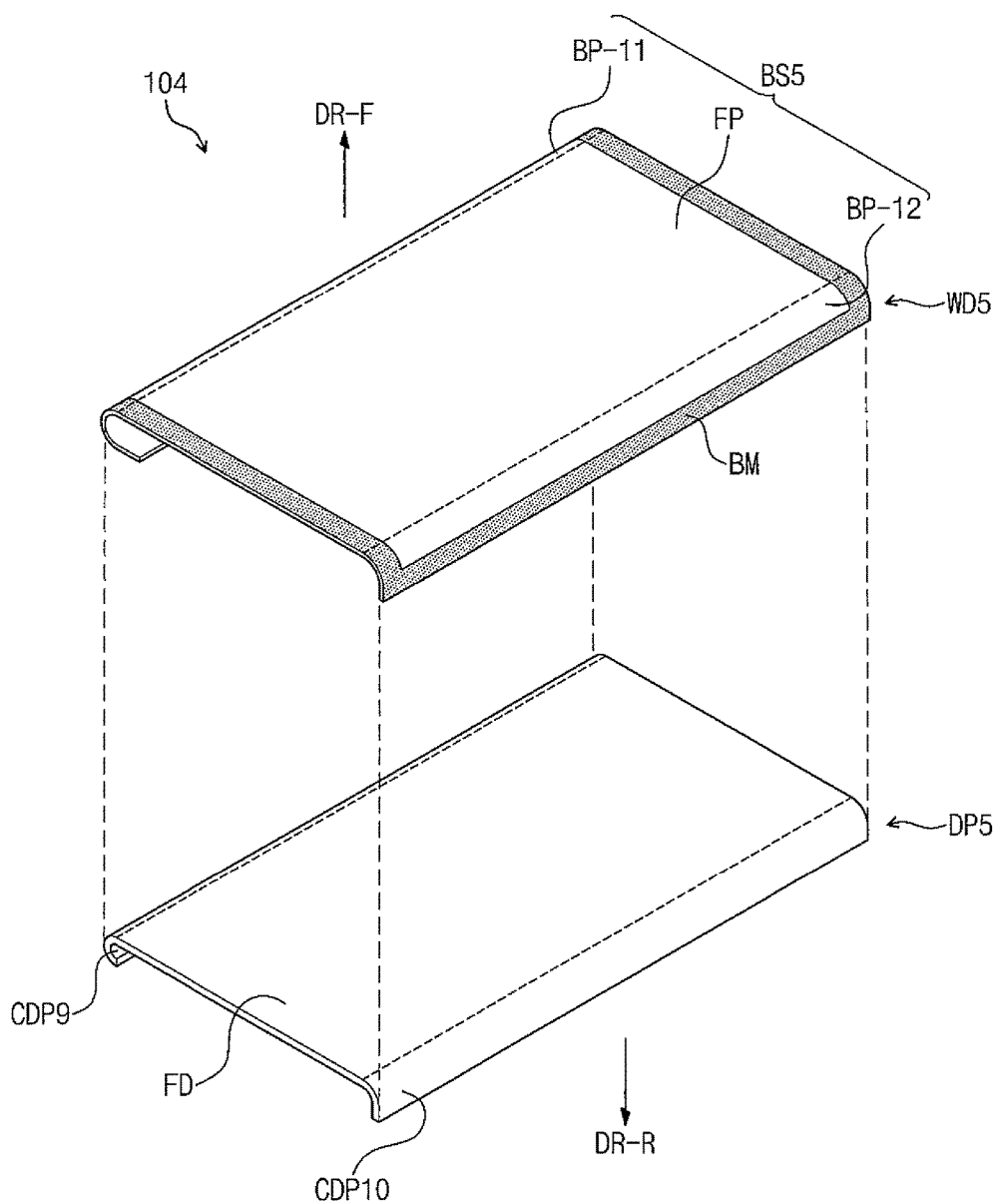
FIG. 7B is a perspective view showing a display device including the window shown in FIG. 7A.

FIG. 7A is a perspective view showing a window WD5 according to another exemplary embodiment of the present disclosure, and FIG. 7B is a perspective view showing a display device 104 including the window WD5 shown in FIG. 7A. In FIGS. 7A and 7B, the same reference numerals denote the same elements in the earlier described embodiments, and thus, detailed descriptions of the same elements may be omitted.

Referring to FIG. 7A, the window WD5 includes a base substrate BS5, a light blocking layer BM, and a coating layer. The base substrate BS5 includes (e.g., is formed of) at least two polymer materials different from each other as its composition material and includes a flat cover portion FP, a bending portion BP-11, and a sub-bending portion BP-12.

In the present exemplary embodiment, the bending portion BP-11 and the sub-bending portion BP-12 are disposed to correspond to two edges, facing each other, of the window WD5 in a one-to-one correspondence. The bending portion BP-11 and the sub-bending portion BP-12 are bent in the rear direction DR-R.

The bending portion BP-11 is bent at an angle exceeding about 90 degrees and less than about 200 degrees with respect to the flat cover portion FP, and the sub-bending portion BP-12 is bent at an angle smaller than that of the bending portion BP-11 with respect to the flat cover portion FP.

Referring to FIG. 7B, the window WD5 covers a display panel DP5 of the display device 104.

The display panel DP5 is flexible and is bent to correspond to the shape of the bending portion BP-11 and the sub-bending portion BP-12 of the window WD5 described above with reference to FIG. 7A. For example, the display panel DP5 includes a flat display portion FD, a first curved display portion CDP9, and a second curved display portion CDP10. The first curved display portion CDP9 is bent to correspond to the shape of the bending portion BP-11, and the second curved display portion CDP10 is bent to correspond to the shape of the sub-bending portion BP-12.

When the display panel DP5 is coupled to the window WD5, the bending portion BP-11 covers the first curved display portion CDP9, the sub-bending portion BP-12 covers the second curved display portion CDP10, and the flat cover portion FP covers the flat display portion FD.

Figure 8A:
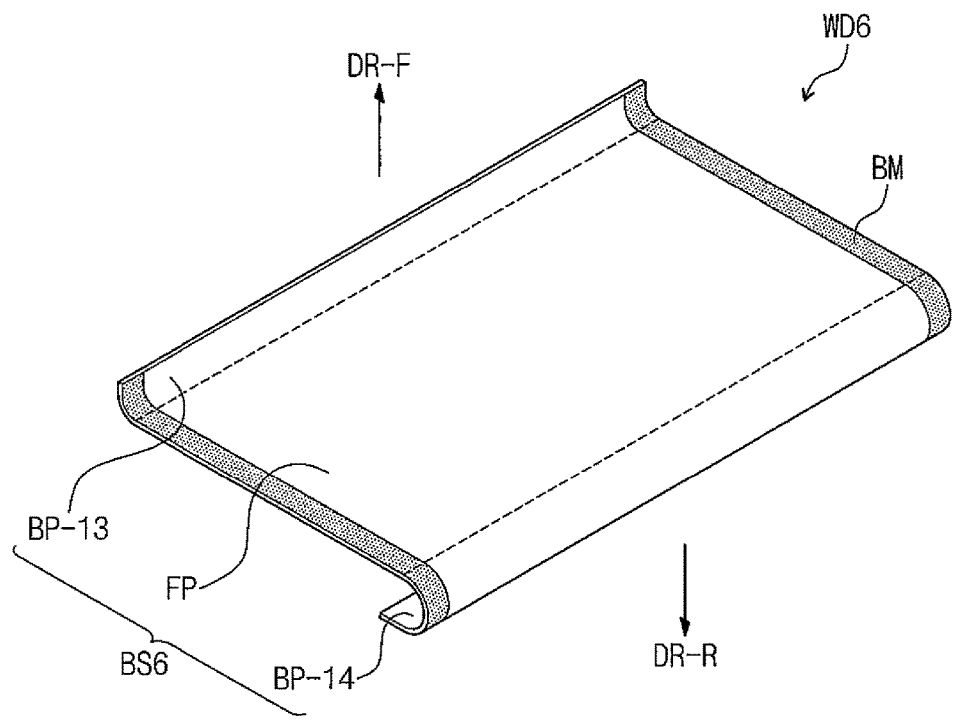
FIG. 8A is a perspective view showing a window according to another exemplary embodiment of the present disclosure.
Figure 8B:
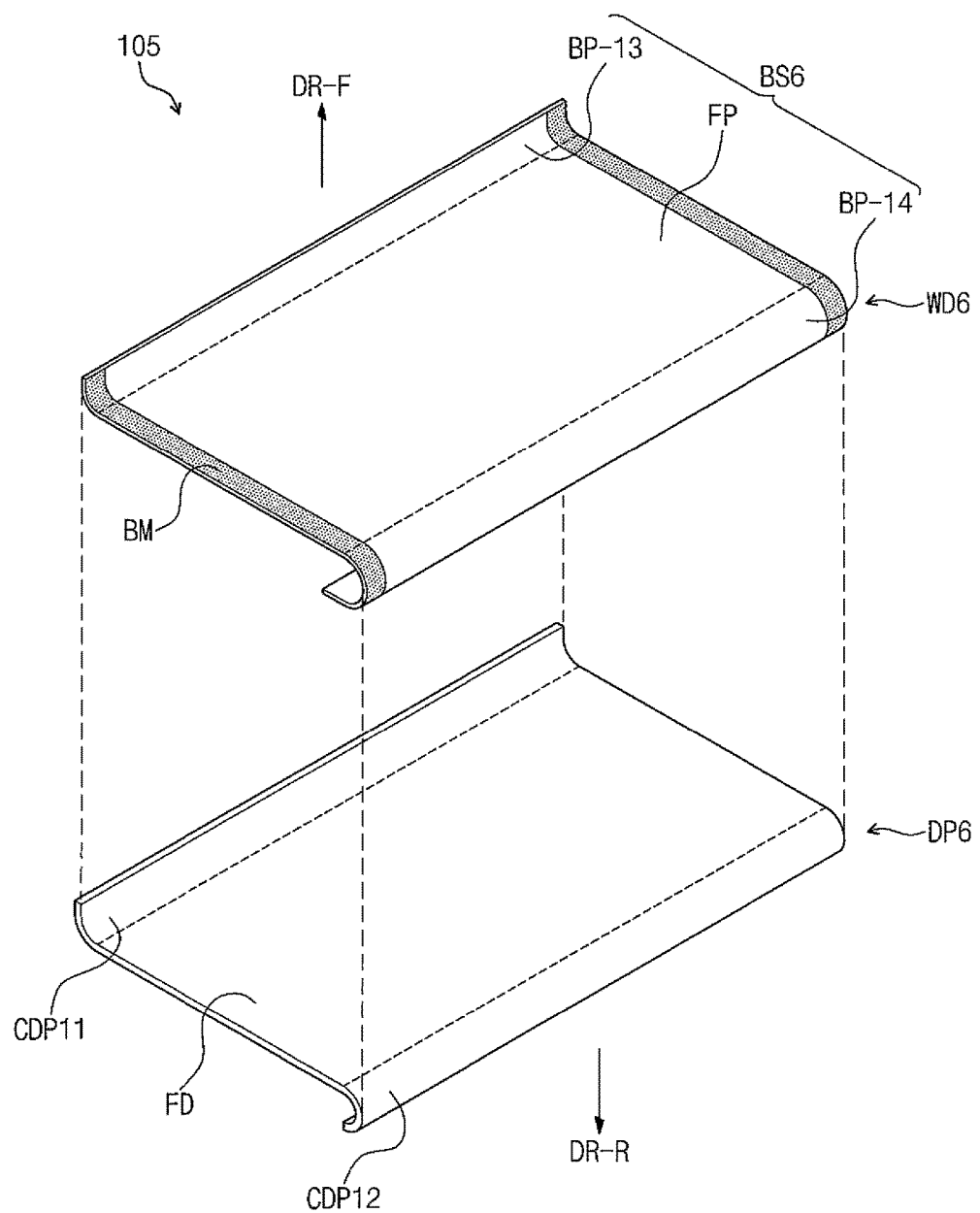
FIG. 8B is a perspective view showing a display device including the window shown in FIG. 8A.

FIG. 8A is a perspective view showing a window WD6 according to another exemplary embodiment of the present disclosure, and FIG. 8B is a perspective view showing a display device 105 including the window WD6 shown in FIG. 8A. In FIGS. 8A and 8B, the same reference numerals denote the same elements in the earlier described embodiments, and thus, detailed descriptions of the same elements may be omitted.

Referring to FIG. 8A, the window WD6 includes a base substrate BS6, a light blocking layer BM, and a coating layer. The base substrate BS6 includes (e.g., is formed of) at least two polymer materials different from each other as its composition material and includes a flat cover portion FP, a bending portion BP-14, and a sub-bending portion BP-13.

In the present exemplary embodiment, the sub-bending portion BP-13 and the bending portion BP-14 are disposed to correspond to two edges, facing each other, of the window WD6 in a one-to-one correspondence. The bending portion BP-14 is bent in the rear direction DR-R of the window WD6, and the sub-bending portion BP-13 is bent in the front direction DR-F of the window WD6.

The bending portion BP-14 is bent at an angle exceeding about 90 degrees and less than about 200 degrees with respect to the flat cover portion FP, and the sub-bending portion BP-13 is bent at an angle smaller than that of the bending portion BP-14 with respect to the flat cover portion FP.

Referring to FIG. 8B, the window WD6 described above with reference to FIG. 8A is applied to the display device 105 to cover a display panel DP6 of the display device 105.

The display panel DP6 is flexible and is bent to correspond to the shape of the window WD6 described above with reference to FIG. 8A. For example, the display panel DP6 includes a flat display portion FD, a first curved display portion CDP11, and a second curved display portion CDP11. The first curved display portion CDP11 is bent to correspond to the shape of the sub-bending portion BP-13, and the second curved display portion CDP12 is bent to correspond to the shape of the bending portion BP-14.

When the display panel DP6 is coupled to the window WD6, the sub-bending portion BP-13 covers the first curved display portion CDP11, the bending portion BP-14 covers the second curved display portion CDP11, and the flat cover portion FP covers the flat display portion FD.

Figure 9A:
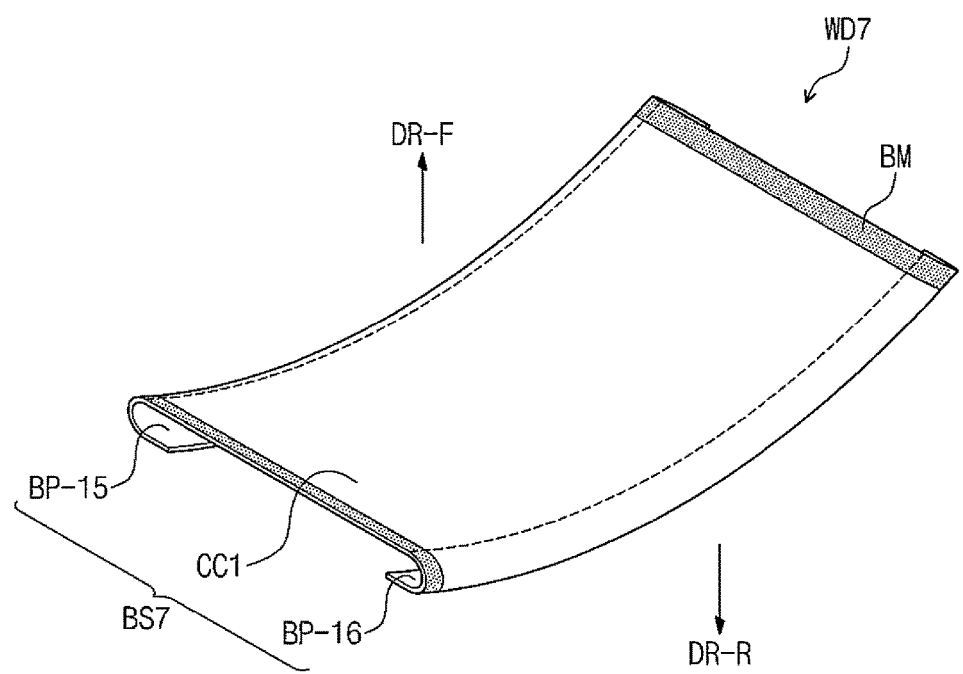
FIG. 9A is a perspective view showing a window according to another exemplary embodiment of the present disclosure.
Figure 9B:
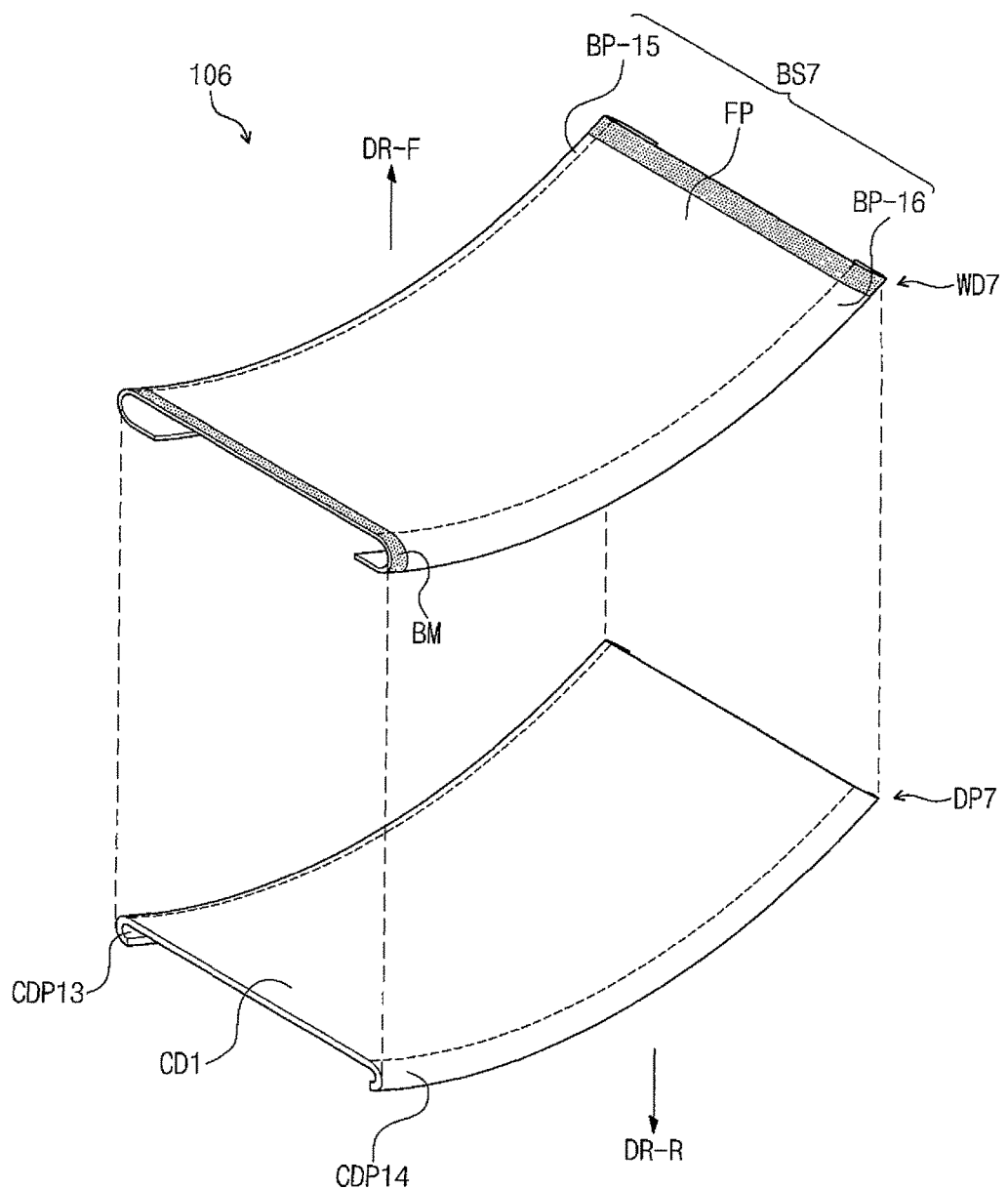
FIG. 9B is a perspective view showing a display device including the window shown in FIG. 9A.

FIG. 9A is a perspective view showing a window WD7 according to another exemplary embodiment of the present disclosure, and FIG. 9B is a perspective view showing a display device 106 including the window WD7 shown in FIG. 9A. In FIGS. 9A and 9B, the same reference numerals denote the same elements in the earlier described embodiments, and thus, detailed descriptions of the same elements may be omitted.

Referring to FIG. 9A, the window WD7 includes a base substrate BS7, a light blocking layer BM, and a coating layer. The base substrate BS7 includes (e.g., is formed of) at least two polymer materials different from each other as its composition material and includes a curved cover portion CC1, a first bending portion BP-15, and a second bending portion BP-16.

The curved cover portion CC1 is connected to and disposed between the first and second bending portions BP-15 and BP-16. In the present exemplary embodiment, the curved cover portion CC1 has a radius of curvature that is greater than a radius of curvature of each of the first and second bending portions BP-15 and BP-16.

In the present exemplary embodiment, the curved cover portion CC1 has a substantially concave curved surface.

Referring to FIG. 9B, the window WD7 described above with reference to FIG. 9A is applied to the display device 106 to cover a display panel DP7 of the display device 106.

The display panel DP7 is flexible and is bent to correspond to the shape of the window WD7 described above with reference to FIG. 9A. For example, the display panel DP7 includes a main curved display portion CD1, a first curved display portion CDP13, and a second curved display portion CDP14.

In the present exemplary embodiment, a radius of curvature of the main curved display portion CD1 is greater than a radius of curvature of each of the first and second curved display portions CDP13 and CDP14.

When the display panel DP7 is coupled to the window WD7, the curved cover portion CC1 covers the main curved display portion CD1, the first bending portion BP-15 covers the first curved display portion CDP13, and the second bending portion BP-16 covers the second curved display portion CDP14.

Figure 10A:
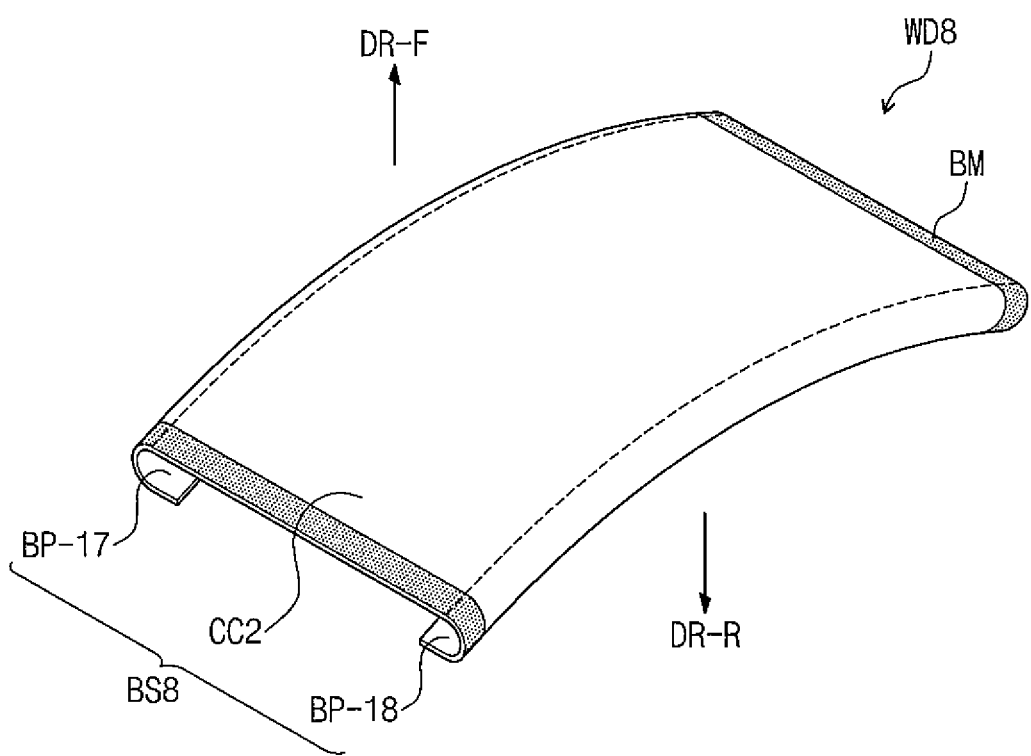
FIG. 10A is a perspective view showing a window according to another exemplary embodiment of the present disclosure.
Figure 10B:
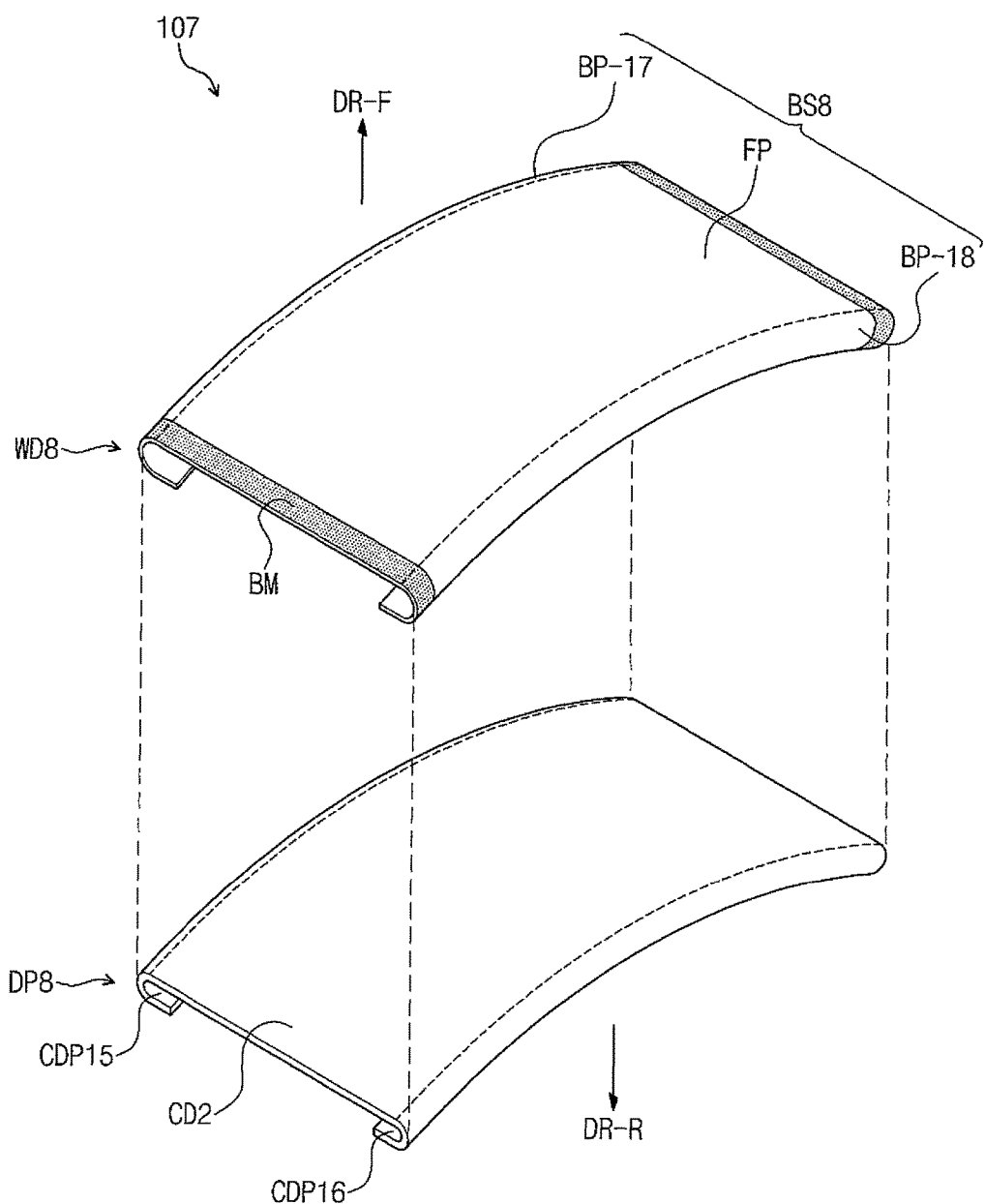
FIG. 10B is a perspective view showing a display device including the window shown in FIG. 10A.

FIG. 10A is a perspective view showing a window WD8 according to another exemplary embodiment of the present disclosure, and FIG. 10B is a perspective view showing a display device 107 including the window WD8 shown in FIG. 10A. In FIGS. 10A and 10B, the same reference numerals denote the same elements in the earlier described embodiments, and thus, detailed descriptions of the same elements may be omitted.

Referring to FIG. 10A, the window WD8 includes a base substrate BS8, a light blocking layer BM, and a coating layer. The base substrate BS8 includes (e.g., is formed of) at least two polymer materials different from each other as its composition material and includes a curved cover portion CC2, a first bending portion BP-17, and a second bending portion BP-18.

The curved cover portion CC2 is connected to and disposed between the first and second bending portions BP-17 and BP-18. In the present exemplary embodiment, the curved cover portion CC2 has a radius of curvature greater than a radius of curvature of each of the first and second bending portions BP-17 and BP-18.

In the present exemplary embodiment, the curved cover portion CC2 has a substantially convex curved surface.

Referring to FIG. 10B, the window WD8 described above with reference to FIG. 10A is applied to the display device 107 to cover a display panel DP8 of the display device 107.

The display panel DP8 is flexible and is bent to correspond to the shape of the window WD8 described above with reference to FIG. 10A. For example, the display panel DP8 includes a main curved display portion CD2, a first curved display portion CDP15, and a second curved display portion CDP16. In the present exemplary embodiment, a radius of curvature of the main curved display portion CD2 is greater than a radius of curvature of each of the first and second curved display portions CDP15 and CDP16.

When the display panel DP8 is coupled to the window WD8, the curved cover portion CC2 covers the main curved display portion CD2, the first bending portion BP-17 covers the first curved display portion CDP15, and the second bending portion BP-18 covers the second curved display portion CDP16.

Figure 11A:
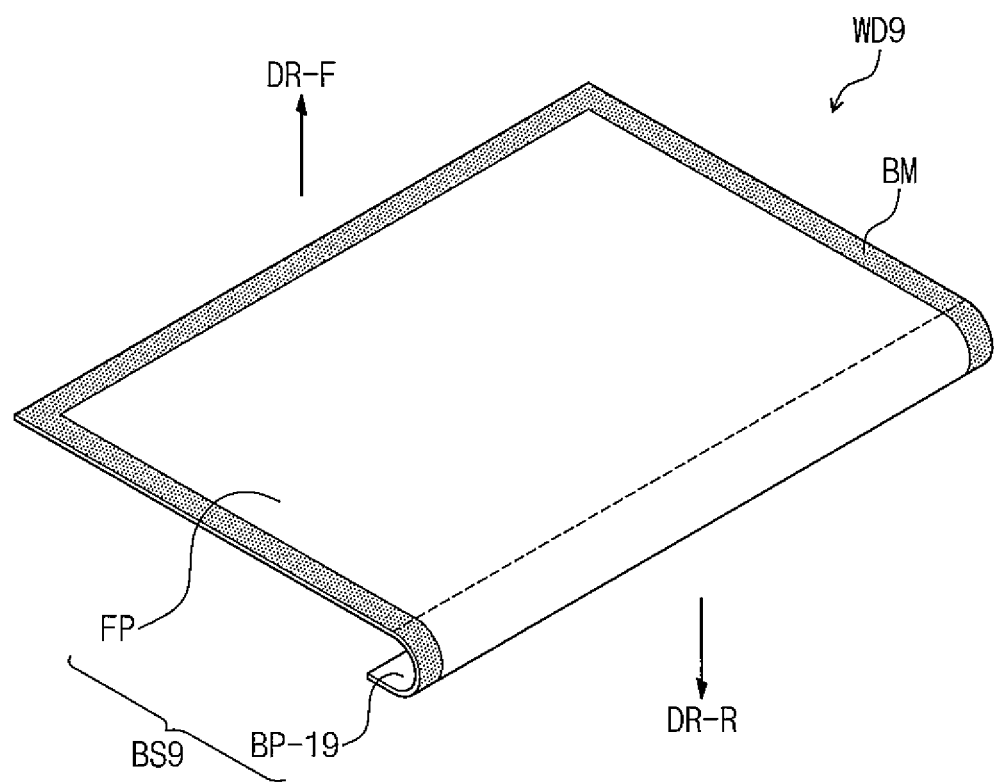
FIG. 11A is a perspective view showing a window according to another exemplary embodiment of the present disclosure.
Figure 11B:
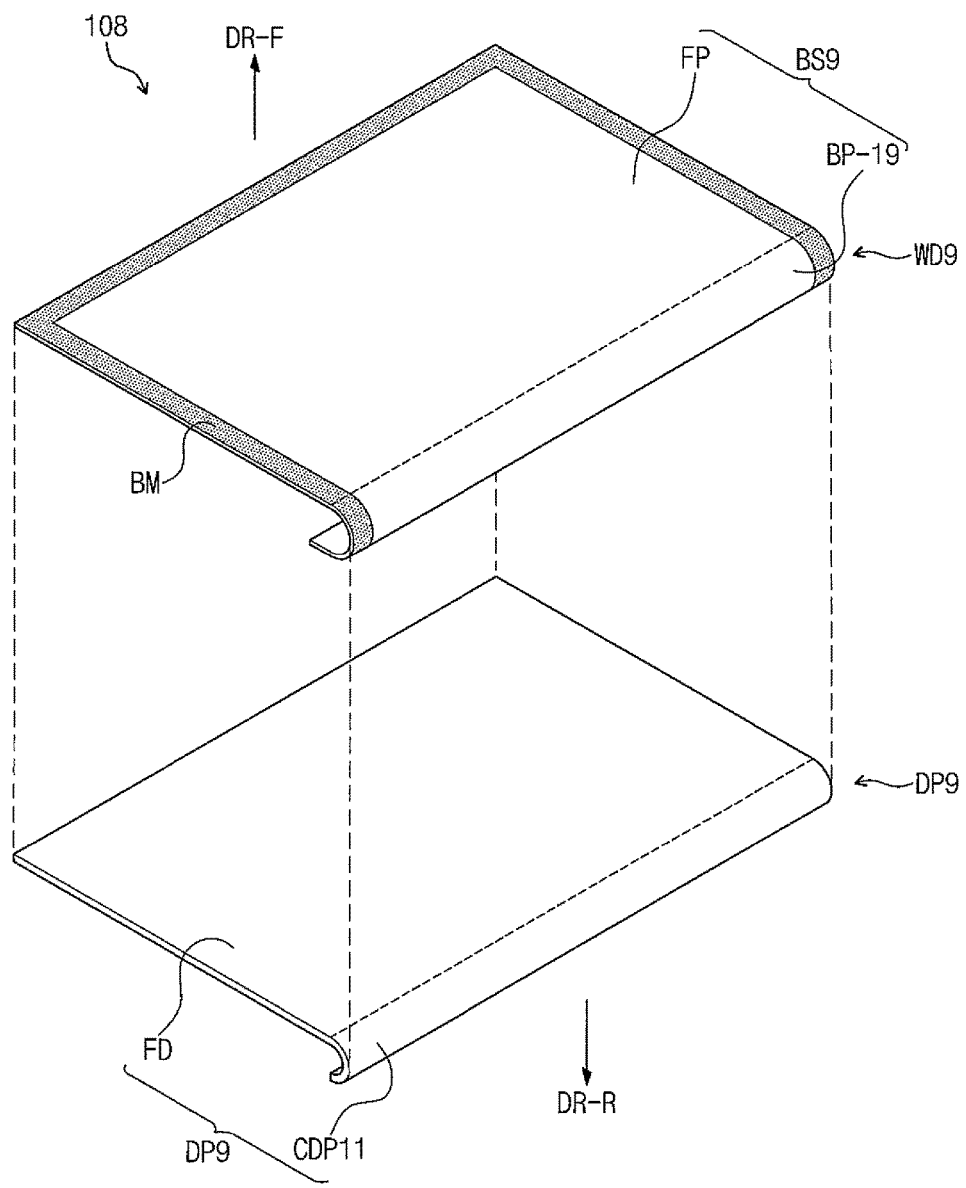
FIG. 11B is a perspective view showing a display device including the window shown in FIG. 11A.

FIG. 11A is a perspective view showing a window WD9 according to another exemplary embodiment of the present disclosure, and FIG. 11B is a perspective view showing a display device 108 including the window WD9 shown in FIG. 11A. In FIGS. 11A and 11B, the same reference numerals denote the same elements in the earlier described embodiments, and thus, detailed descriptions of the same elements may be omitted.

Referring to FIG. 11A, the window WD9 includes a base substrate BS9, a light blocking layer BM, and a coating layer. The base substrate BS9 includes (e.g., is formed of) at least two polymer materials that are different from each other as its composition material and includes a flat cover portion FP and a bending portion BP-19.

The bending portion BP-19 is disposed to correspond to one edge of the window WD9, and the bending portion BP-19 is bent in the rear direction DR-R. For example, the bending portion BP-19 is bent at an angle exceeding about 90 degrees and less than about 200 degrees.

Referring to FIG. 11B, the window WD9 covers a display panel DP9 of the display device 108.

The display panel DP9 is flexible and is bent to correspond to the shape of the bending portion BP-19 of the window WD9 described with reference to FIG. 11A. For example, the display panel DP9 includes a flat display portion FD and a curved display portion CDP11, and the curved display portion CDP11 is bent to correspond to the shape of the bending portion BP-19.

When the display panel DP9 is coupled to the window WD9, the bending portion BP-19 covers the curved display portion CDP11 and the flat cover portion FP covers the flat display portion FD.

Figure 12:
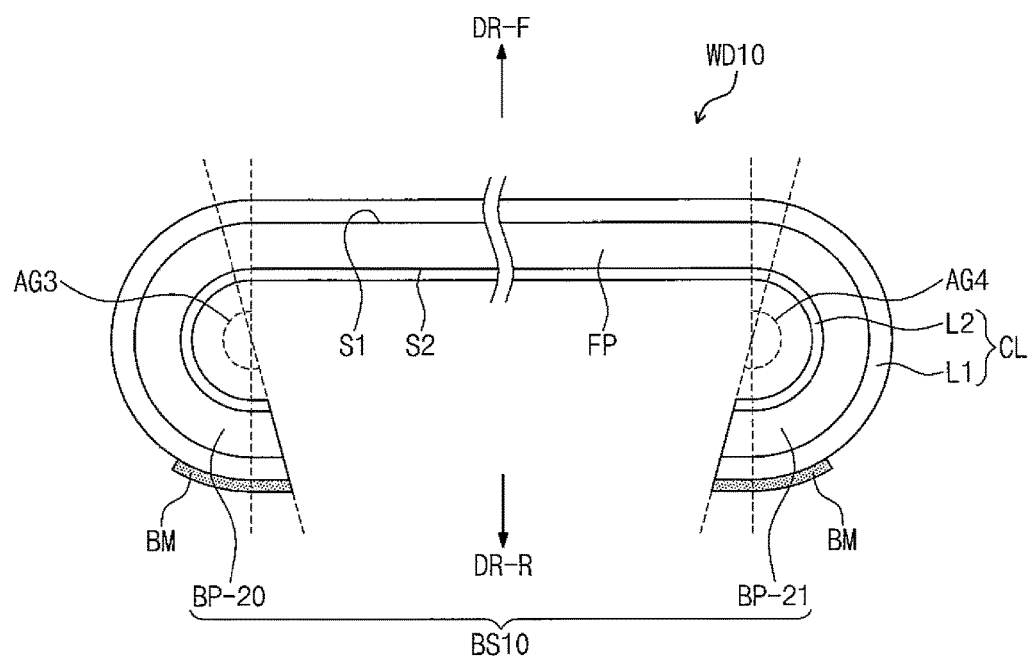
FIG. 12 is a cross-sectional view showing a window according to another exemplary embodiment of the present disclosure.

FIG. 12 is a cross-sectional view showing a window WD10 according to another exemplary embodiment of the present disclosure. In FIG. 12, the same reference numerals denote the same elements in the earlier described embodiments, and thus, detailed descriptions of the same elements may be omitted.

Referring to FIG. 12, the window WD10 includes a base substrate BS10, a coating layer CL, and a light blocking layer BM. The base substrate BS10 includes a flat cover portion FP, a first bending portion BP-20, and a second bending portion BP-21. In addition, the base substrate BS10 includes (e.g., is formed of) at least two polymer materials different from each other as its composition material.

The flat cover portion FP has a flat shape and covers a flat area of the display panel. In addition, each of the first and second bending portions BP-20 and BP-21 covers a bending portion of the display panel and a curved display area of the display panel.

In the present exemplary embodiment, the first and second bending portions BP-20 and BP-21 are disposed to correspond to two edges facing each other of the window WD10 in a one-to-one correspondence. In addition, each of the first and second bending portions BP-20 and BP-21 is bent in the rear direction DR-R of the window WD10.

The first bending portion BP-20 is connected to the flat cover portion FP, the second bending portion BP-21 is connected to the flat cover portion FP, and the flat cover portion FP is disposed between the first and second bending portions BP-20 and BP-21. In addition, the first bending portion BP-20 and the second bending portion BP-21 are disposed to be symmetrical with each other with respect to a reference line defined by the front direction DR-F to divide the base substrate BS10 into two equal parts.

In the present exemplary embodiment, each of the first and second bending portions BP-20 and BP-21 is bent at an angle exceeding about 90 degrees and less than about 200 degrees with respect to the base substrate BS10. For example, when the first bending portion BP-20 is bent at a first angle AG3 in a counter-clockwise direction with respect to the flat cover portion FP and the second bending portion BP-21 is bent at a second angle AG4 in a clockwise direction with respect to the flat cover portion FP, each of the first and second angles AG3 and AG4 may be about 195 degrees.

Figure 13:
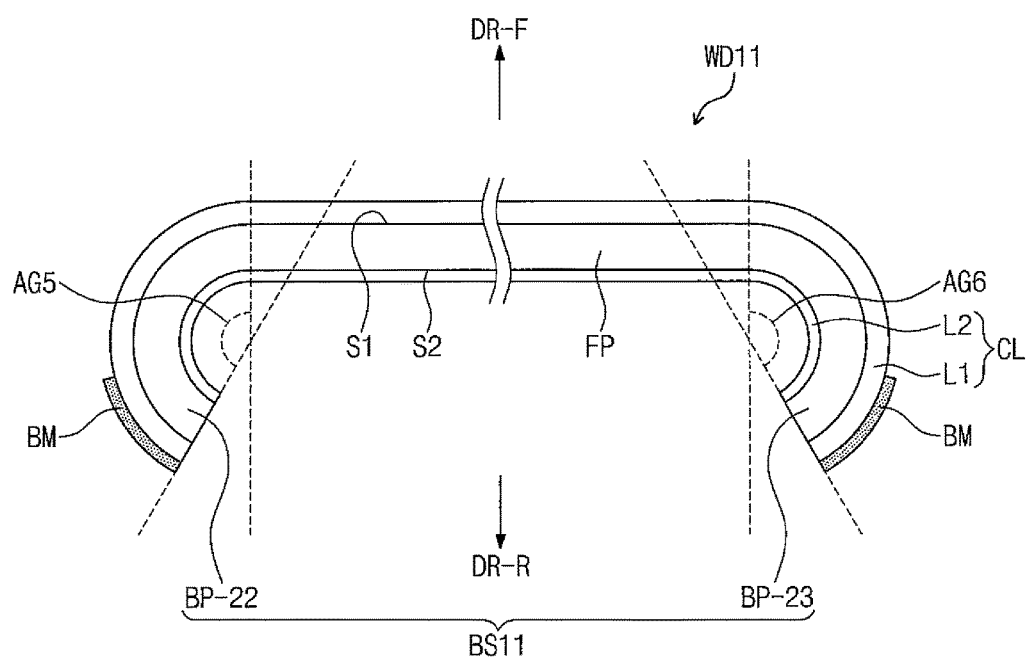
FIG. 13 is a cross-sectional view showing a window according to another exemplary embodiment of the present disclosure.

FIG. 13 is a cross-sectional view showing a window WD11 according to another exemplary embodiment of the present disclosure. In FIG. 13, the same reference numerals denote the same elements in the earlier described embodiments, and thus, detailed descriptions of the same elements may be omitted.

Referring to FIG. 13, the window WD11 includes a base substrate BS11, a coating layer CL, and a light blocking layer BM. The base substrate BS11 includes a flat cover portion FP, a first bending portion BP-22, and a second bending portion BP-23. In addition, the base substrate BS11 includes (e.g., is formed of) at least two polymer materials different from each other as its composition material.

In the present exemplary embodiment, the first and second bending portions BP-22 and BP-23 cover a bending portion of a display panel and a curved display area of the display panel, respectively. The first and second bending portions BP-22 and BP-23 are disposed to correspond to two edges facing each other of the window WD11 in a one-to-one correspondence. In addition, each of the first and second bending portions BP-22 and BP-23 is bent in the rear direction DR-R of the window WD11.

The first bending portion BP-22 is connected to the flat cover portion FP, the second bending portion BP-23 is connected to the flat cover portion FP, and the flat cover portion FP is disposed between the first and second bending portions BP-22 and BP-23. In addition, the first bending portion BP-22 and the second bending portion BP-23 are disposed to be symmetrical with each other with respect to a reference line defined by the front direction DR-F to divide the base substrate BS11 into two equal parts.

In the present exemplary embodiment, each of the first and second bending portions BP-22 and BP-23 is bent at an angle exceeding about 90 degrees and less than about 200 degrees with respect to the base substrate BS11. For example, when the first bending portion BP-22 is bent at a first angle AG5 in a counter-clockwise direction with respect to the flat cover portion FP and the second bending portion BP-23 is bent at a second angle AG6 in a clockwise direction with respect to the flat cover portion FP, each of the first and second angles AG5 and AG6 may be about 150 degrees.

Figure 14A:
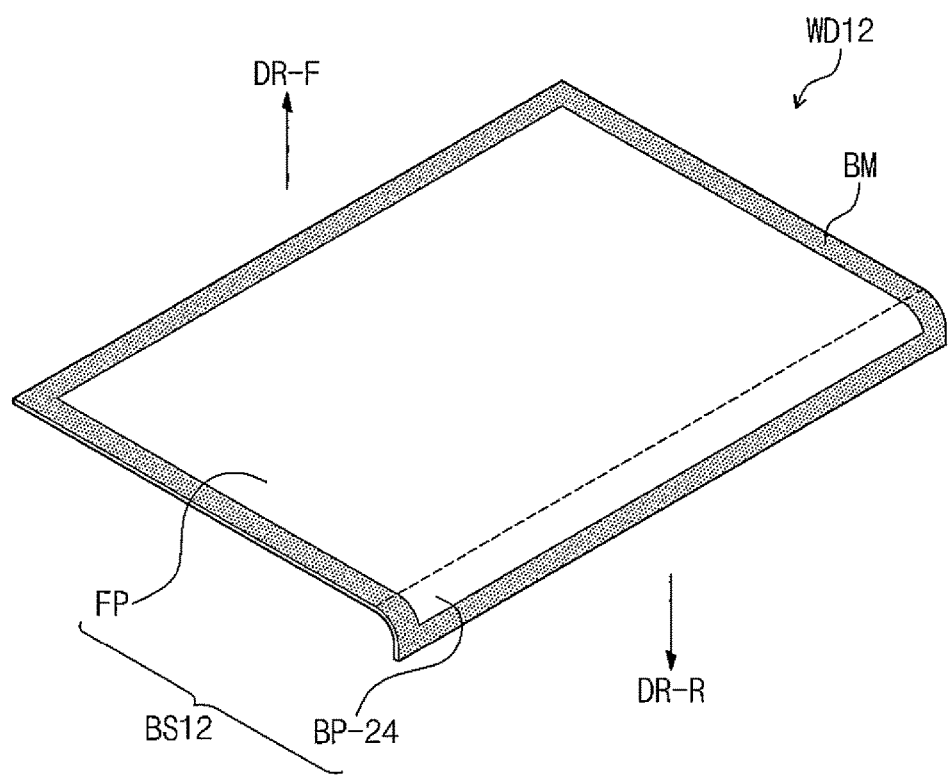
FIG. 14A is a perspective view showing a window according to another exemplary embodiment of the present disclosure.
Figure 14B:
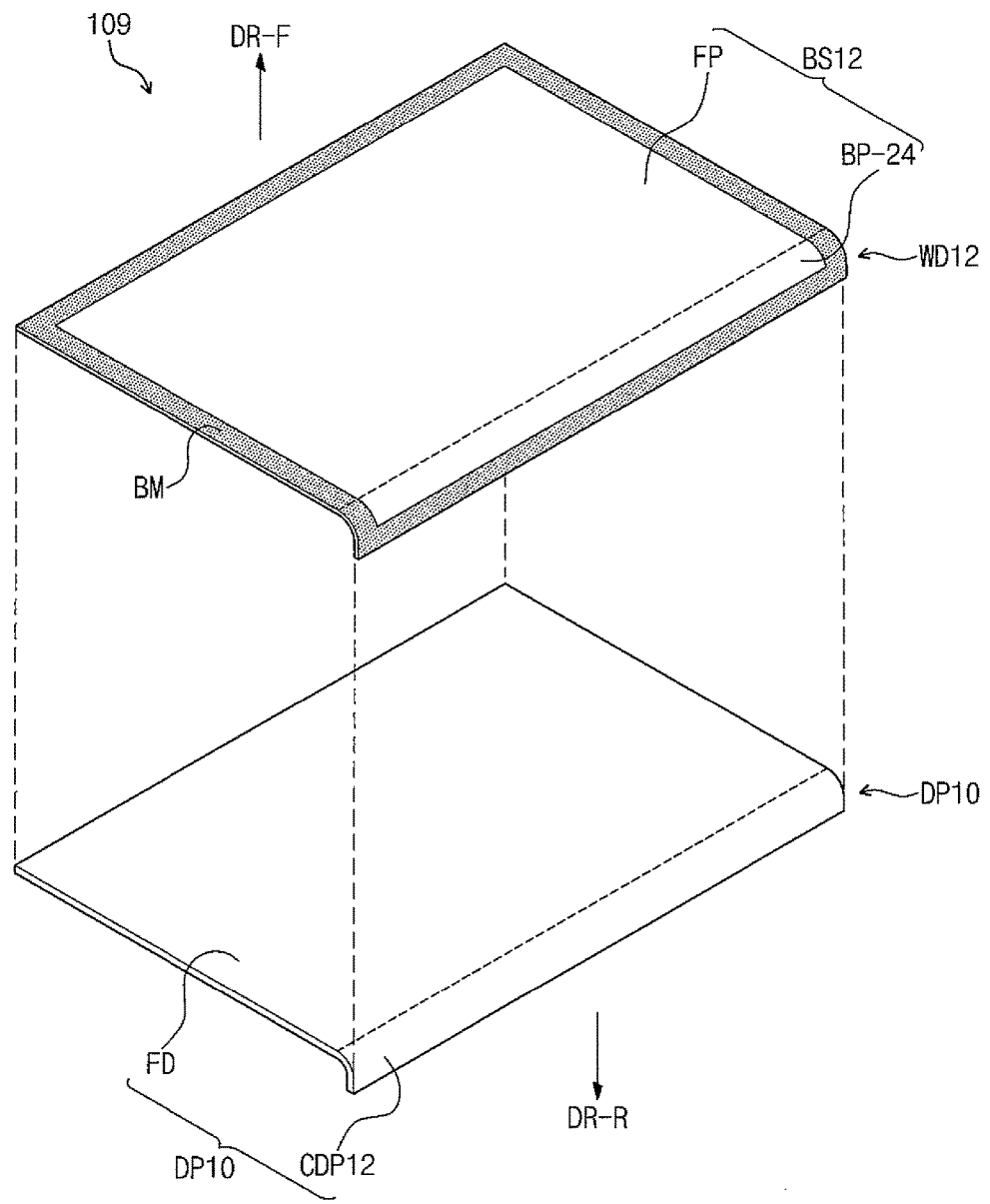
FIG. 14B is a perspective view showing a display device including the window shown in FIG. 14A.

FIG. 14A is a perspective view showing a window WD12 according to another exemplary embodiment of the present disclosure, and FIG. 14B is a perspective view showing a display device 109 including the window WD12 shown in FIG. 14A. In FIGS. 14A and 14B, the same reference numerals denote the same elements in the earlier described embodiments, and thus, detailed descriptions of the same elements may be omitted.

Referring to FIG. 14A, the window WD12 includes a base substrate BS12, a light blocking layer BM, and a coating layer. The base substrate BS12 includes (e.g., is formed of) at least two polymer materials different from each other as its composition material and includes a flat cover portion FP and a bending portion BP-24.

The bending portion BP-24 is disposed to correspond to one edge of the window WD12. In addition, the bending portion BP-24 is bent in the rear direction DR-R. For example, the bending portion BP-24 is bent at an angle exceeding about 90 degrees with respect to the flat cover portion FP.

Referring to FIG. 14B, the window WD12 covers a display panel DP10 of the display device 109.

The display panel DP10 is flexible and is bent to correspond to the shape of the bending portion BP-24 of the window WD12 described above with reference to FIG. 14A. For example, the display panel DP10 includes a flat display portion FD and a curved display portion CDP12, and the curved display portion CDP12 is bent to correspond to the shape of the bending portion BP-24.

When the display panel DP10 is coupled to the window WD12, the bending portion BP-24 covers the curved display portion CDP12 and the flat cover portion FP covers the flat display portion FD.

Figure 15A:
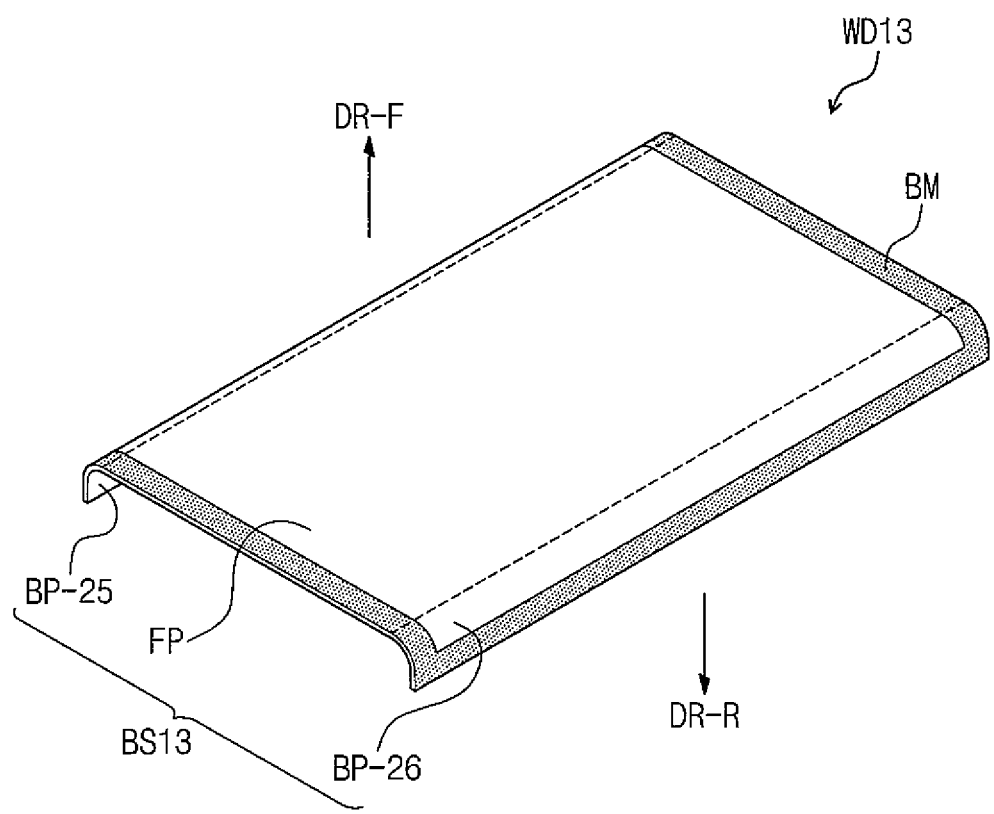
FIG. 15A is a perspective view showing a window according to another exemplary embodiment of the present disclosure.
Figure 15B:
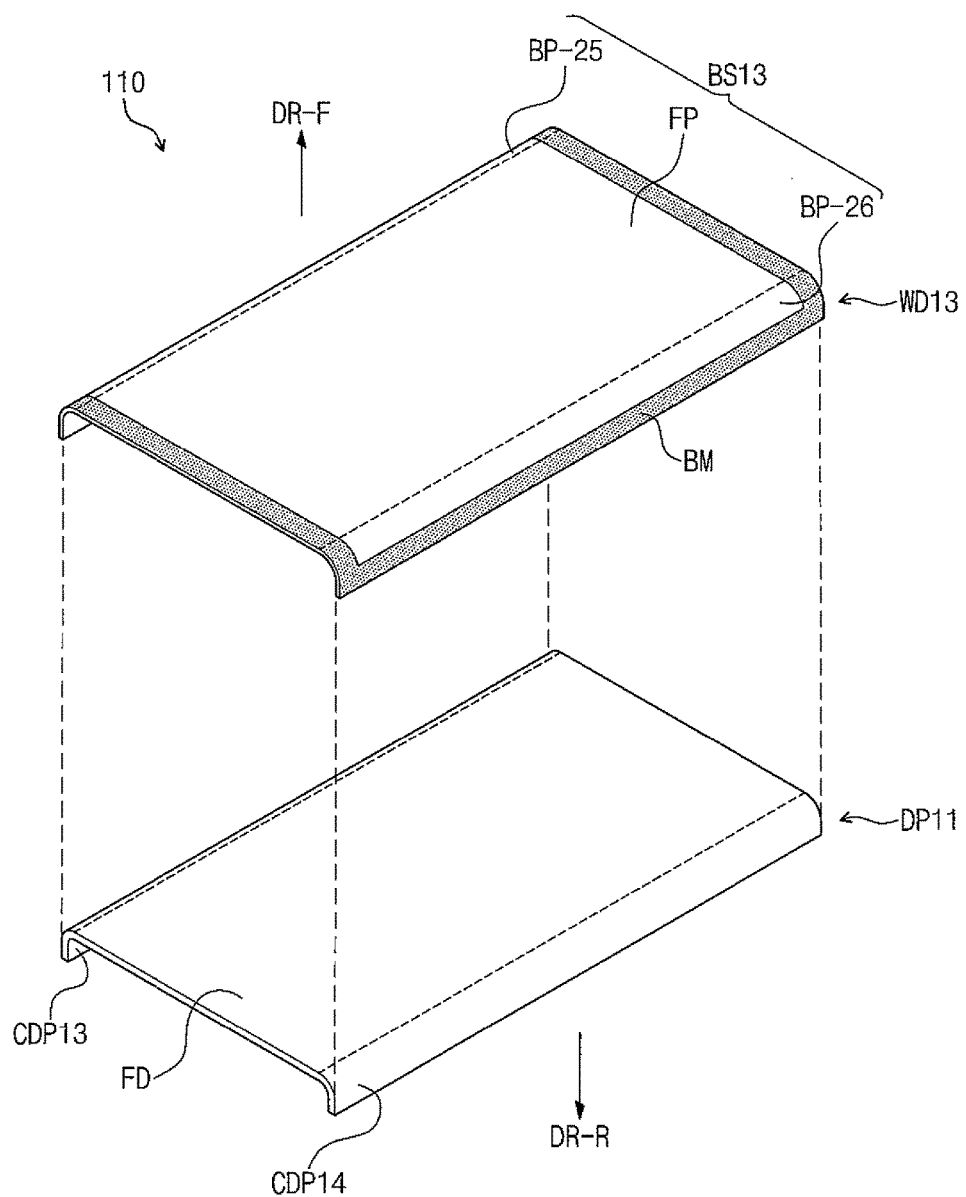
FIG. 15B is a perspective view showing a display device including the window shown in FIG. 15A.

FIG. 15A is a perspective view showing a window WD13 according to another exemplary embodiment of the present disclosure, and FIG. 15B is a perspective view showing a display device 110 including the window WD13 shown in FIG. 15A. In FIGS. 15A and 15B, the same reference numerals denote the same elements in the earlier described embodiments, and thus, detailed descriptions of the same elements may be omitted.

Referring to FIG. 15A, the window WD13 includes a base substrate BS13, a light blocking layer BM, and a coating layer. The base substrate BS13 includes (e.g., is formed of) at least two polymer materials different from each other as its composition material and includes a flat cover portion FP, a first bending portion BP-25, and a second bending portion BP-26.

In the present exemplary embodiment, the first bending portion BP-25 and the second bending portion BP-26 are disposed to correspond to two edges, facing each other, of the window WD13 in a one-to-one correspondence. In addition, each of the first bending portion BP-25 and the second bending portion BP-26 is bent in the rear direction DR-R.

In the present exemplary embodiment, each of the first bending portion BP-25 and the second bending portion BP-26 is bent at an angle of about 90 degrees with respect to the flat cover portion FP.

Referring to FIG. 15B, the window WD13 covers a display panel DP11 of the display device 110.

The display panel DP11 is flexible and is bent to correspond to the shape of the first and second bending portions BP-25 and BP-26 of the window WD13. For example, the display panel DP11 includes a flat display portion FD, a first curved display portion CDP13, and a second curved display portion CDP14. The first curved display portion CDP13 is bent to correspond to the shape of the first bending portion BP-25, and the second curved display portion CDP14 is bent to correspond to the shape of the second bending portion BP-26.

When the display panel DP11 is coupled to the window WD13, the first bending portion BP-25 covers the first curved display portion CDP13, the second bending portion BP-26 covers the second curved display portion CDP14, and the flat cover portion FP covers the flat display portion FD.

Figure 16A:
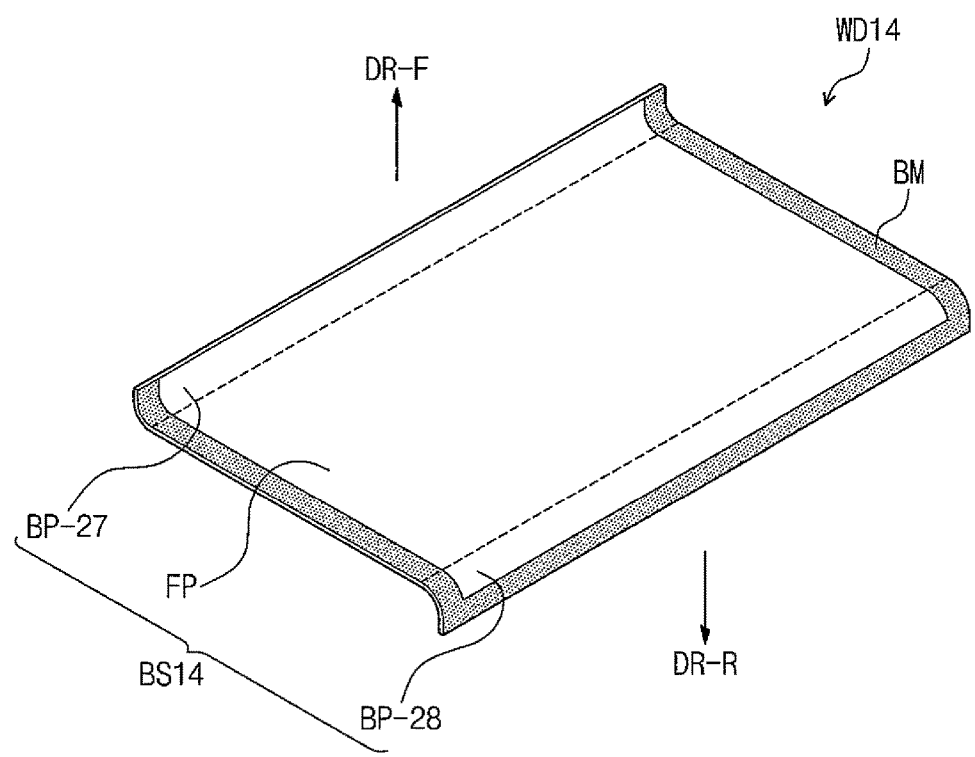
FIG. 16A is a perspective view showing a window according to another exemplary embodiment of the present disclosure.
Figure 16B:
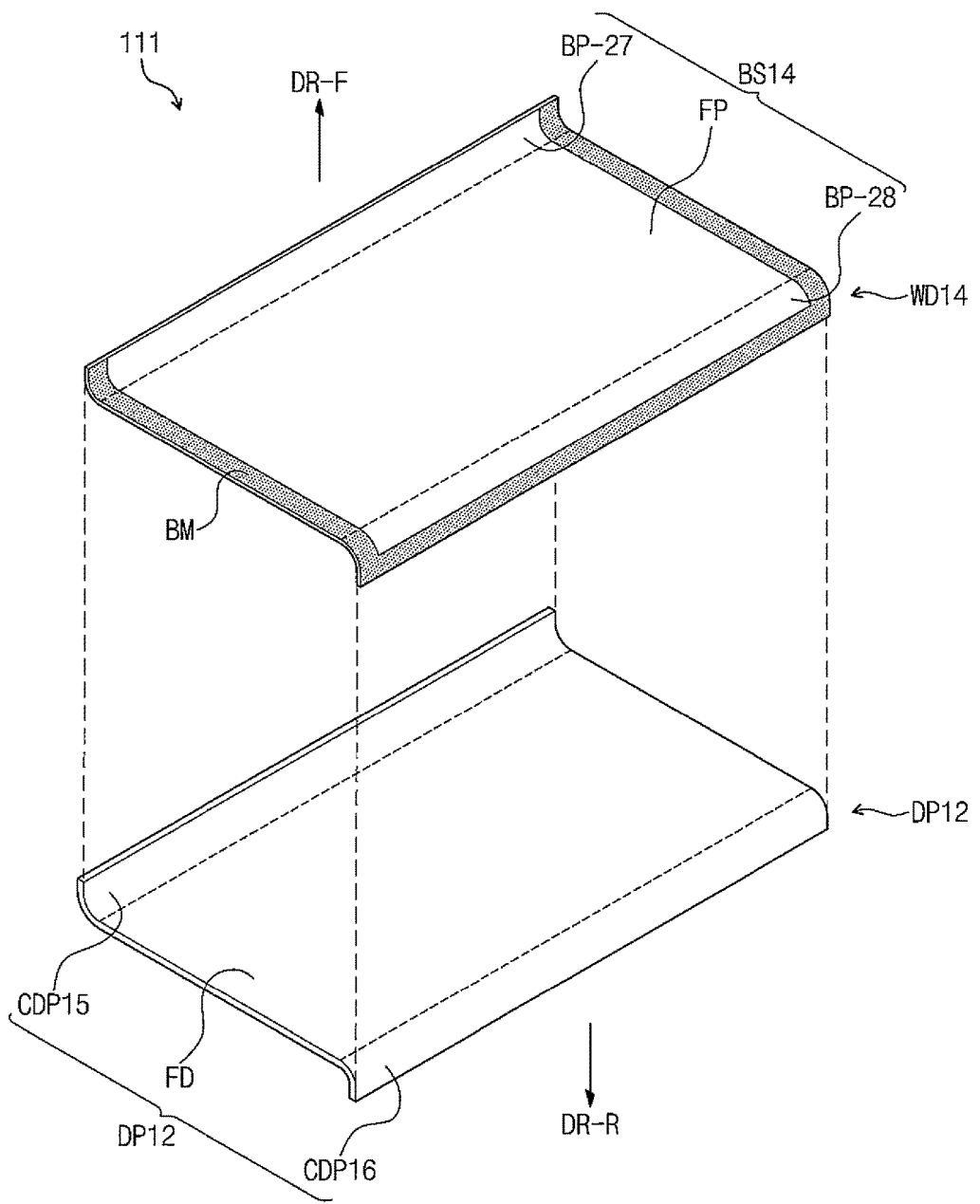
FIG. 16B is a perspective view showing a display device including the window shown in FIG. 16A.

FIG. 16A is a perspective view showing a window WD14 according to another exemplary embodiment of the present disclosure, and FIG. 16B is a perspective view showing a display device 111 including the window WD14 shown in FIG. 16A. In FIGS. 16A and 16B, the same reference numerals denote the same elements in the earlier described embodiments, and thus, detailed descriptions of the same elements may be omitted.

Referring to FIG. 16A, the window WD14 includes a base substrate BS14, a light blocking layer BM, and a coating layer. The base substrate BS14 includes a flat cover portion FP, a first bending portion BP-27, and a second bending portion BP-28. The base substrate BS14 includes (e.g., is formed of) at least two polymer materials different from each other as its composition material.

In the present exemplary embodiment, the first and second bending portions BP-27 and BP-28 are disposed to correspond to two edges, facing each other, of the window WD14 in a one-to-one correspondence. In addition, each of the first bending portion BP-27 and the second bending portion BP-28 is bent at an angle of about 90 degrees with respect to the base substrate BS14.

The first bending portion BP-27 is bent in the front direction DR-F of the window WD14, and the second bending portion BP-28 is bent in the rear direction DR-R of the window WD14.

Referring to FIG. 16B, the window WD14 covers a display panel DP12 of the display device 111.

The display panel DP12 is flexible and is bent to correspond to the shape of the first and second bending portions BP-27 and BP-28 of the window WD14. For example, the display panel DP12 includes a flat display portion FD, a first curved display portion CDP15, and a second curved display portion CDP16. The first curved display portion CDP15 is bent in the front direction DR-F to correspond to the shape of the first bending portion BP-27, and the second curved display portion CDP16 is bent in the rear direction DR-R to correspond to the shape of the second bending portion BP-28. In addition, the flat display portion FD has a flat shape corresponding to the flat cover portion FD.

When the display panel DP12 is coupled to the window WD14, the first bending portion BP-27 covers the first curved display portion CDP15, the second bending portion BP-28 covers the second curved display portion CDP16, and the flat cover portion FP covers the flat display portion FD. Accordingly, the window WD14 covers the surface of the display panel DP12, on which the image is displayed, to protect the display panel DP12 from external impacts and stress.

Figure 17A:
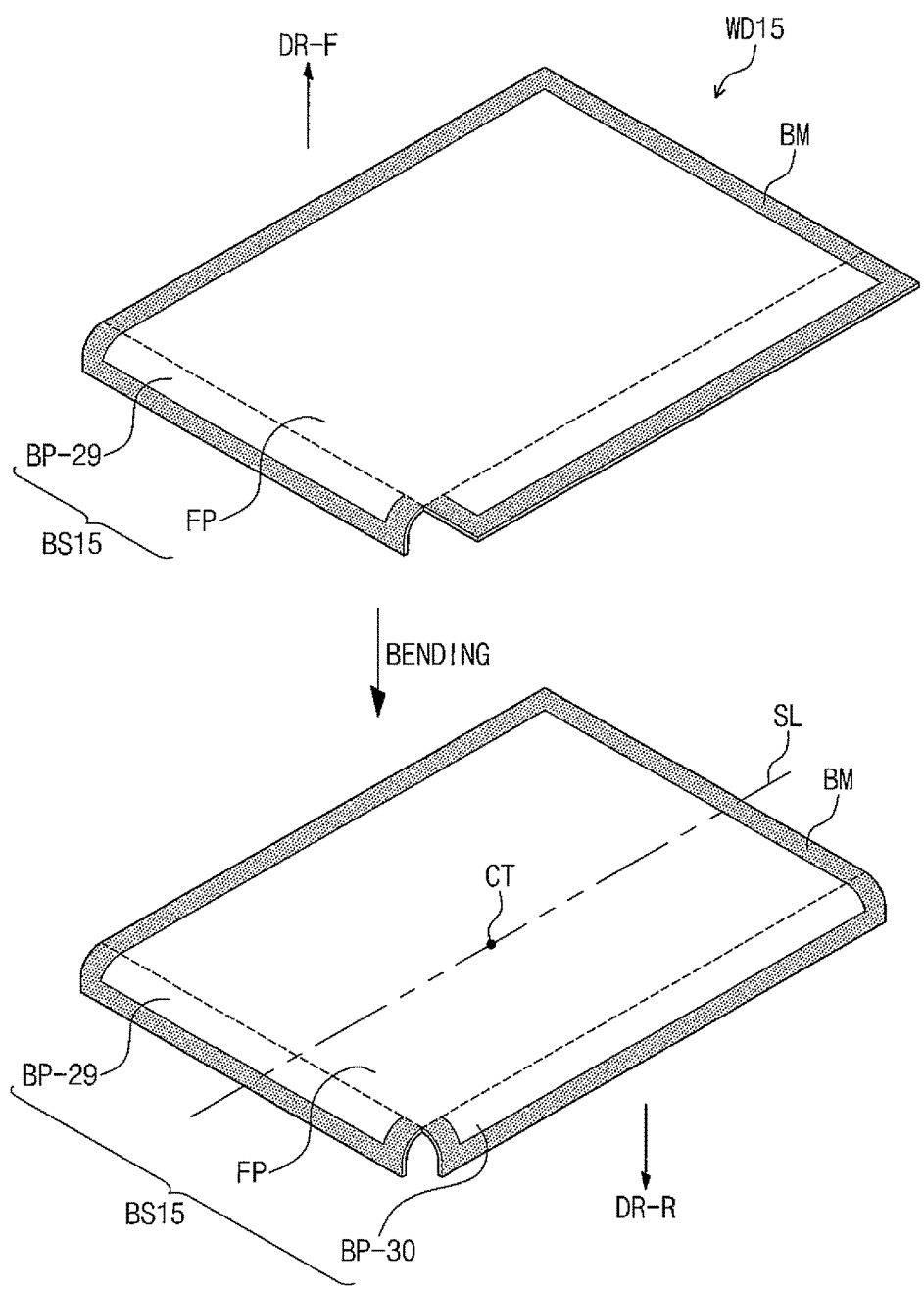
FIG. 17A is a perspective view showing a window according to another exemplary embodiment of the present disclosure.
Figure 17B:
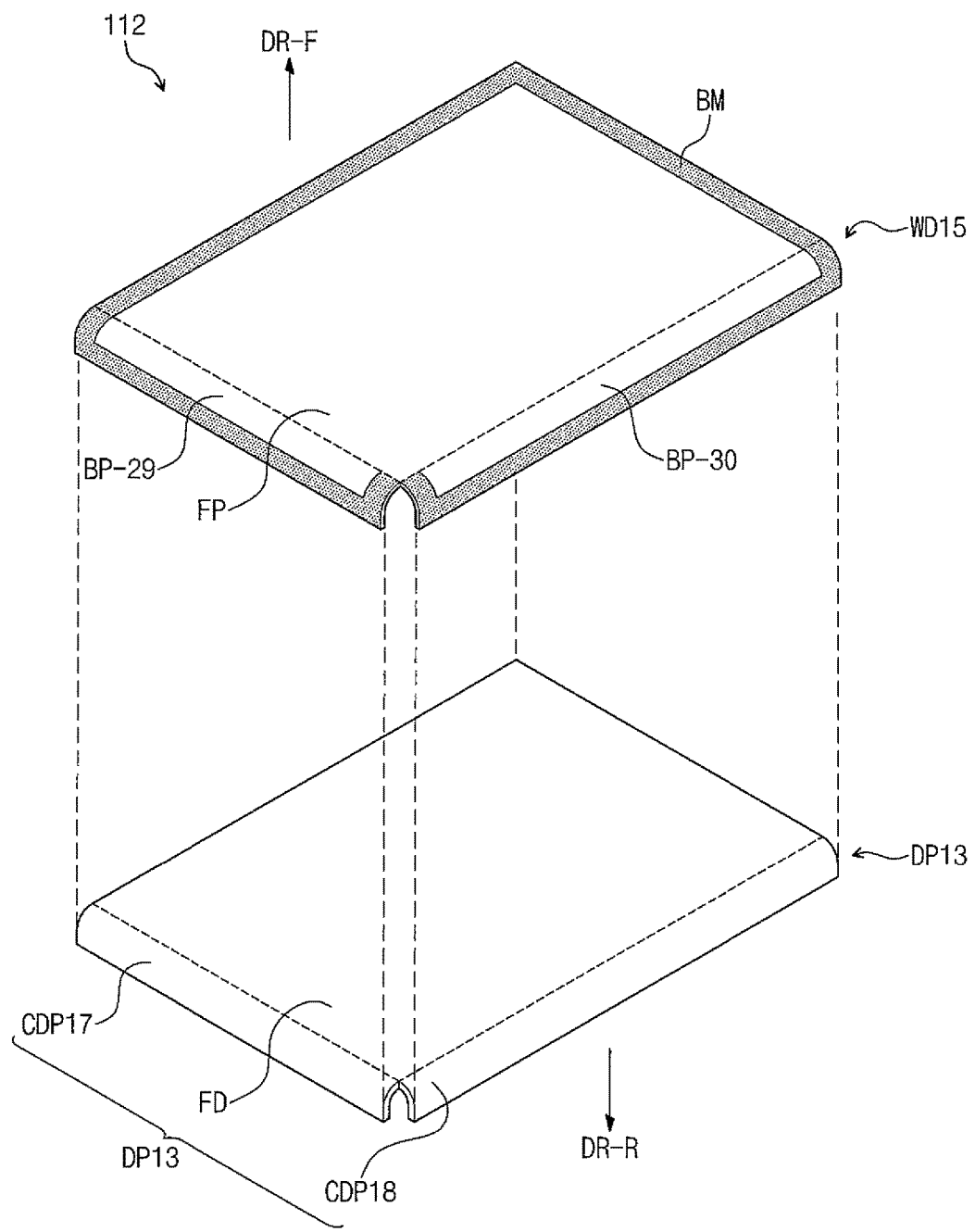
FIG. 17B is a perspective view showing a display device including the window shown in FIG. 17A.

FIG. 17A is a perspective view showing a window WD15 according to another exemplary embodiment of the present disclosure, and FIG. 17B is a perspective view showing a display device 112 including the window WD15 shown in FIG. 17A. In FIGS. 17A and 17B, the same reference numerals denote the same elements in the earlier described embodiments, and thus, detailed descriptions of the same elements may be omitted.

Referring to FIG. 17A, the window WD15 includes a base substrate BS15, a light blocking layer BM, and a coating layer. The base substrate BS15 includes (e.g., is formed of) at least two polymer materials different from each other as its composition material and includes a flat cover portion FP, a first bending portion BP-29, and a second bending portion BP-30.

In the present exemplary embodiment, the first and second bending portions BP-27 and BP-28 are disposed to correspond to two edges, not facing each other, of the window WD15 in a one-to-one correspondence. Thus, the first bending portion BP-29 and the second bending portion BP-30 are disposed to be asymmetrical with each other with respect to a reference line SL crossing a center position CT of the base substrate BS15 to divide the base substrate BS15 into two equal parts.

In the present exemplary embodiment, each of the first bending portion BP-29 and the second bending portion BP-30 is bent in the rear direction DR-R with respect to the base substrate BS15, and each of the first bending portion BP-29 and the second bending portion BP-30 is bent in the rear direction DR-R at an angle of about 90 degrees with respect to the flat cover portion FP.

Referring to FIG. 17B, the window WD15 covers a display panel DP13 of the display device 112.

The display panel DP13 is flexible and is bent to correspond to the shape of the first and second bending portions BP-29 and BP-30 of the window WD15.

For example, the display panel DP13 includes a flat display portion FD, a first curved display portion CDP17, and a second curved display portion CDP18. The first and second curved display portions CDP17 and CDP18 are bent in the rear direction DR-R of the display panel DP13 to correspond to the shapes of the first and second bending portions BP-29 and BP-30, respectively. In addition, the flat display portion FD has a flat shape corresponding to the flat cover portion FD.

In the present exemplary embodiment, each of the first and second curved display portions CDP17 and CDP18 is bent at an angle of about 90 degrees. According to another embodiment, the angle at which each of the first and second curved display portions CDP17 and CDP18 is bent exceeds about 90 degrees and is less than about 200 degrees.

When the display panel DP13 is coupled to the window WD15, the first bending portion BP-29 covers the first curved display portion CDP17, the second bending portion BP-30 covers the second curved display portion CDP18, and the flat cover portion FP covers the flat display portion FD.

Although exemplary embodiments of the present invention have been described, it is understood that the present invention should not be limited to the described exemplary embodiments. Various changes and modifications can be made by one ordinary skilled in the art within the spirit and scope of the present invention as defined by the appended claims and their equivalents.

What is claimed is:

1. A display device comprising:
    a display panel comprising a first base substrate and a plurality of pixels on the first base substrate, the display panel having a first curved display portion; and
    a window on and covering the display panel and comprising a second base substrate having a light transmittance, the plurality of pixels disposed between the first base substrate and the second base substrate, the second base substrate being formed of a composition material comprising a plurality of different polymer materials and comprising a bent portion covering the first curved display portion.

2. The display device of claim 1, wherein the bent portion is bent at an angle exceeding about 90 degrees and less than about 200 degrees with respect to the second base substrate.

3. The display device of claim 1, wherein the bent portion is bent at an angle exceeding about 30 degrees and equal to or less than about 90 degrees with respect to the second base substrate.

4. The display device of claim 1, wherein the different polymer materials comprise a first polymer having a continuous phase and a second polymer having a dispersed phase.

5. The display device of claim 4, wherein the first polymer is present in an amount of about 60 weight percent to about 95 weight percent with respect to the total material of the second base substrate, and the second polymer is present in an amount of about 5 weight percent to about 40 weight percent with respect to the total material of the second base substrate.

6. The display device of claim 4, wherein the first polymer comprises polycarbonate (PC), and the second polymer comprises at least one of polymethyl methacrylate (PMMA), polyethylene terephthalate (PET), polyethersulfone (PES), and polyethylene naphthalate (PEN).

7. The display device of claim 4, wherein the second polymer comprises two different polymer materials, and each of the two different polymer materials has a dispersed phase.

8. The display device of claim 4, wherein the composition material further comprises a compatibilizer to uniformly disperse the second polymer.

9. The display device of claim 1, wherein the window further comprises a coating layer on the second base substrate, the coating layer comprising:
    a first layer on a front surface of the second base substrate; and
    a second layer on a rear surface of the second base substrate, the rear surface of the second base substrate facing the plurality of the pixels, and
    wherein the first layer has a thickness greater than a thickness of the second layer.

10. The display device of claim 1, wherein the second base substrate comprises a plurality of bent portions, and two of the bent portions from among the plurality of bent portions are symmetrical with each other with respect to a reference line crossing a center of the second base substrate.

11. The display device of claim 1, wherein the second base substrate comprises a plurality of bent portions, and two of the bent portions from among the plurality of bent portions are asymmetrical with each other with respect to a reference line crossing a center of the second base substrate.

12. The display device of claim 1, wherein the second base substrate comprises a plurality of bent portions, and each of the bent portions is bent in a rear direction of the window.

13. The display device of claim 1, wherein the second base substrate comprises a plurality of bent portions, and wherein at least one of the bent portions is bent in a front direction of the window, and at least one of the bent portions is bent in a rear direction of the window.

14. The display device of claim 1, wherein the second base substrate comprises a plurality of bent portions, and the bent portions correspond to edges of the second base substrate in a one-to-one correspondence.

15. The display device of claim 14, wherein a corner portion of the second base substrate between two adjacent ones of the bent portions is cut.

16. The display device of claim 1, wherein the second base substrate further comprises a sub-bent portion bent at an angle less than the bent portion, and
wherein the display panel further comprises a second curved display portion covered by the sub-bent portion.

17. The display device of claim 16, wherein the bent portion is bent at an angle exceeding about 90 degrees and less than about 200 degrees with respect to the second base substrate, and the sub-bent portion is bent at an angle exceeding about 30 degrees and equal to or less than about 90 degrees with respect to the second base substrate.

18. The display device of claim 16, wherein the bent portion and the sub-bent portion are bent in a rear direction of the window.

19. The display device of claim 16, wherein the bent portion is bent in one of a front direction and a rear direction of the window, and the sub-bent portion is bent in the other of the front direction and the rear direction.

20. The display device of claim 1, wherein the display panel further comprises a flat display portion, and
wherein the second base substrate further comprises a flat cover portion extending from the bent portion and covering the flat display portion of the display panel.

21. The display device of claim 1, further comprising a light blocking layer on an edge of the base substrate,
wherein a portion of the light blocking layer is on the bent portion.

22. A display device comprising:
a display panel comprising a first curved display portion; and
a window covering the display panel and comprising a base substrate having a light transmittance, the base substrate being formed of a composition material comprising a plurality of different polymer materials and comprising a bent portion covering the first curved display portion,
wherein the display panel further comprises a main curved display portion extending from the first curved display portion, the main curved display portion having a radius of curvature greater than a radius of curvature of the first curved display portion, and
wherein the base substrate further comprises a curved cover portion extending from the bent portion, the curved cover portion having a radius of curvature greater than a radius of curvature of the bent portion and covering the main curved display portion.

23. A window covering a light emitting surface of a display device, the window comprising:
a base substrate having a light transmittance, the base substrate having a front surface and a rear surface closer to the light emitting surface than the front surface is in a cross-sectional view, with the light emitting surface of the display device facing the base substrate in the cross-sectional view, and the base substrate being formed of a composition material comprising a plurality of different polymer materials and comprising a bent portion; and
a coating layer on at least one of the front surface and the rear surface.

24. The window of claim 23, wherein the bent portion is bent at an angle exceeding about 90 degrees and less than about 200 degrees with respect to the base substrate.

25. The window of claim 23, wherein the bent portion is bent at an angle exceeding about 30 degrees and equal to or less than about 90 degrees with respect to the base substrate.

26. The window of claim 23, wherein the different polymer materials comprise a first polymer having a continuous phase and a second polymer having a dispersed phase.

27. The window of claim 26, wherein the first polymer is present in an amount of about 60 weight percent to about 95 weight percent with respect to the total material of the base substrate, and the second polymer is present in an amount of about 5 weight percent to about 40 weight percent with respect to the total material of the base substrate.

28. The window of claim 26, wherein the first polymer comprises polycarbonate (PC), and the second polymer comprises at least one of polymethyl methacrylate (PMMA), polyethylene terephthalate (PET), polyethersulfone (PES), and polyethylene naphthalate (PEN).

29. The window of claim 23, wherein the coating layer comprises:
a first layer on the front surface of the base substrate; and
a second layer on the rear surface of the base substrate, and
wherein the first layer has a thickness greater than a thickness of the second layer.

30. The window of claim 23, wherein the base substrate comprises a plurality of bent portions, and two of the bent portions from among the plurality of bent portions are symmetrical with each other with respect to a reference line crossing a center of the base substrate.

31. The window of claim 23, wherein the base substrate comprises a plurality of bent portions, and two of the bent portions from among the plurality of bent portions are asymmetrical with each other with respect to a reference line crossing a center of the base substrate.

32. The window of claim 23, wherein the base substrate comprises a plurality of bent portions, and each of the bent portions is bent in a rear direction of the window.

33. The window of claim 23, wherein the base substrate comprises a plurality of bent portions, at least one of the bent portions being bent in one of a front direction and a rear direction of the window, and at least one of the bent portions being bent in the other of the front direction and the rear direction.

34. The window of claim 23, wherein the base substrate comprises a plurality of bent portions, and the bent portions correspond to edges of the base substrate in a one-to-one correspondence.

35. The window of claim 23, wherein the base substrate further comprises a sub-bent portion bent at an angle less than the bent portion.

36. The window of claim 35, wherein the bent portion is bent at an angle exceeding about 90 degrees and less than about 200 degrees with respect to the base substrate, and the sub-bent portion is bent at an angle exceeding about 30 degrees and equal to or less than about 90 degrees with respect to the base substrate.

37. The window of claim 23, wherein the base substrate further comprises a flat cover portion extending from the bent portion and having a flat shape.

38. The window of claim 23, wherein the base substrate further comprises a curved cover portion extending from the bent portion, the curved cover portion having a radius of curvature greater than a radius of curvature of the bent portion.

39. The window of claim 23, further comprising a light blocking layer on an edge of the base substrate,
   wherein a portion of the light blocking layer is on the bent portion.

* * * * *